(12) United States Patent
Iwamoto et al.

(10) Patent No.: US 8,531,224 B2
(45) Date of Patent: *Sep. 10, 2013

(54) SHIFT REGISTER, SCANNING SIGNAL LINE DRIVE CIRCUIT PROVIDED WITH SAME, AND DISPLAY DEVICE

(75) Inventors: Akihisa Iwamoto, Osaka (JP); Hideki Morii, Osaka (JP); Takayuki Mizunaga, Osaka (JP); Shinya Tanaka, Osaka (JP); Tetsuo Kikuchi, Osaka (JP); Takaharu Yamada, Osaka (JP); Satoshi Horiuchi, Osaka (JP); Chikao Yamasaki, Osaka (JP); Kei Ikuta, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/501,215

(22) PCT Filed: Jul. 15, 2010

(86) PCT No.: PCT/JP2010/061944
§ 371 (c)(1),
(2), (4) Date: Apr. 10, 2012

(87) PCT Pub. No.: WO2011/055569
PCT Pub. Date: May 12, 2011

(65) Prior Publication Data
US 2012/0200544 A1   Aug. 9, 2012

(30) Foreign Application Priority Data

Nov. 4, 2009  (JP) ................................ 2009-252687

(51) Int. Cl.
*H03K 3/00* (2006.01)
(52) U.S. Cl.
USPC ............ 327/199; 327/208; 327/212; 345/204

(58) Field of Classification Search
USPC ............ 327/64, 91, 144, 154, 166, 199, 200, 327/201, 208, 210, 211, 212, 213, 223, 225; 345/204
See application file for complete search history.

(56) References Cited

U.S. PATENT DOCUMENTS

| 5,708,455 | A | * | 1/1998 | Maekawa ...................... 345/100 |
| 5,859,630 | A |   | 1/1999 | Huq |

(Continued)

FOREIGN PATENT DOCUMENTS

| JP | 2001-506044 | 5/2001 |
| JP | 2004-227751 | 8/2004 |

(Continued)

OTHER PUBLICATIONS

International Search Report.

*Primary Examiner* — Lincoln Donovan
*Assistant Examiner* — Jung H. Kim
(74) *Attorney, Agent, or Firm* — Harness, Dickey & Pierce, P.L.C.

(57) ABSTRACT

An object is shortening a clock fall-rise period while suppressing an increase in a circuit area, an increase in current consumption, and a cost increase, without generating an abnormal operation, in a shift register within a monolithic gate driver.

In a shift register (410) that operates based on four-phase clock signals, including two-phase clock signals (GCK1, GCK3) that are provided to odd-order stages and two-phase clock signals (GCK2, GCK4) that are provided to even-order stages, of which phases are shifted by 90 degrees from each other, a potential of a first clock (CKA) appears as a potential of a scanning signal (GOUT), when a potential of a first node is at a high level, in each stage. In this configuration, the potential of the first node included in each stage is set to a high level based on a pulse of a scanning signal outputted from a pre-stage, and is set to a low level based on a pulse of a scanning signal outputted from a third stage after a stage concerned.

28 Claims, 31 Drawing Sheets

(56) References Cited

U.S. PATENT DOCUMENTS

| | | |
|---|---|---|
| 6,778,626 B2 | 8/2004 | Yu |
| 7,873,140 B2* | 1/2011 | Moon et al. ............... 377/76 |
| 2004/0150610 A1 | 8/2004 | Zebedee et al. |
| 2005/0008114 A1 | 1/2005 | Moon |
| 2006/0267911 A1 | 11/2006 | Jang |
| 2008/0219401 A1 | 9/2008 | Tobita |
| 2010/0321372 A1 | 12/2010 | Iwamoto et al. |
| 2011/0018845 A1* | 1/2011 | Mizunaga et al. ......... 345/204 |
| 2011/0134090 A1 | 6/2011 | Iwamoto et al. |
| 2011/0199354 A1 | 8/2011 | Iwase et al. |
| 2011/0291712 A1* | 12/2011 | Tobita ..................... 327/144 |
| 2012/0200544 A1* | 8/2012 | Iwamoto et al. .......... 345/204 |
| 2012/0218245 A1* | 8/2012 | Morii et al. ............... 345/211 |
| 2012/0235020 A1* | 9/2012 | Decker ..................... 250/208.1 |

FOREIGN PATENT DOCUMENTS

| | | |
|---|---|---|
| JP | 2005050502 A | 2/2005 |
| JP | 2006-331633 A | 12/2006 |
| JP | 2008-217902 | 9/2008 |
| JP | 2008276849 A | 11/2008 |
| JP | 2009-223051 A | 10/2009 |
| JP | 2010-192019 | 9/2010 |
| JP | 2011-055569 | 3/2011 |
| WO | WO-2009104306 A1 | 2/2008 |
| WO | WO-2010-050262 A1 | 5/2010 |
| WO | WO-2010067641 A1 | 6/2010 |

\* cited by examiner

SHIFT REGISTER, SCANNING SIGNAL LINE DRIVE CIRCUIT PROVIDED WITH SAME, AND DISPLAY DEVICE

TECHNICAL FIELD

The present invention relates to a shift register that is provided in a drive circuit of an active matrix-type display device and more particularly, to a shift register within a monolithic scanning signal line drive circuit.

BACKGROUND ART

In recent years, to reduce a size of a display device and to reduce cost, there is being progressed development of a display device in which both a display unit including a pixel circuit and a gate driver for driving a gate bus line (scanning signal line) are formed on the same substrate. FIG. 27 is a block diagram showing an example of a configuration of a gate driver of such a conventional display device. In addition, FIG. 28 is a circuit diagram showing an example of a configuration of one stage of a shift register that constitutes the gate driver.

As shown in FIG. 27, the gate driver includes a shift register 90 of plural stages (the same number of stages as that of gate bus lines). Each stage of the shift register 90 is a bistable circuit that is in either one of two states (a first state and a second state) at each time point, and outputs a signal indicating this state, as a scanning signal. In this way, the shift register 90 includes plural bistable circuits SR. Each bistable circuit SR is provided with input terminals for receiving two-phase clock signals CKA (hereinafter, referred to as a "first clock") and CKB (hereinafter, referred to as a "second clock") respectively, an input terminal for receiving a low-level power source voltage VSS, an input terminal for receiving a set signal SET, an input terminal for receiving a reset signal RESET, and an output terminal for outputting a scanning signal GOUT. The scanning signal GOUT outputted from each stage (bistable circuit) is provided to a next stage as a set signal, and is also provided to a pre-stage as a reset signal.

As shown in FIG. 28, the bistable circuit includes four thin-film transistors T91, T92, T93, and T94, and a capacitor C9. The bistable circuit also includes four input terminals 91 to 94 and an output terminal 95, in addition to the input terminal for the low-level power source voltage VSS. A source terminal of the thin-film transistor T91, a drain terminal of the thin-film transistor T92, and a gate terminal of the thin-film transistor T93 are connected to each other. Note that a region (wiring) in which these terminals are connected to each other is called a "netA" for convenience.

In the thin-film transistor T91, a gate terminal and a drain terminal are connected to the input terminal 91 (that is, in a diode connection), and the source terminal is connected to the netA. In the thin-film transistor T92, a gate terminal is connected to the input terminal 92, the drain terminal is connected to the netA, and a source terminal is connected to the power source voltage VSS. In the thin-film transistor T93, the gate terminal is connected to the netA, a drain terminal is connected to the input terminal 93, and a source terminal is connected to the output terminal 95. In the thin-film transistor T94, a gate terminal is connected to the input terminal 94, a drain terminal is connected to the output terminal 95, and a source terminal is connected to the power source voltage VSS. In the capacitor C9, one end is connected to the netA, and the other end is connected to the output terminal 95.

In the configuration as described above, each stage (bistable circuit) of the shift register 90 operates as follows ideally. Note that FIG. 29 is a timing chart for describing the operation of each stage of the shift register 90. The first clock CKA that becomes at a high level at every other horizontal scanning period is provided to the input terminal 93. The second clock CKB of which a phase is shifted by 180 degrees from a phase of the first clock CKA is provided to the input terminal 94. During a period before a time point t0, a potential of the netA and a potential of the scanning signal GOUT (a potential of the output terminal 95) are at a low level.

When reaching the time point t0, a pulse of the set signal SET is provided to the input terminal 91. Because the thin-film transistor T91 is in a diode connection as shown in FIG. 28, the thin-film transistor T91 becomes in an on state by the pulse of this set signal SET, and the capacitor C9 is charged. As a result, the potential of the netA changes from the low level to a high level, and the thin-film transistor T93 becomes in an on state. In this case, the first clock CKA is at a low level during a period from the time point t0 to the time point t1. Therefore, during this period, the scanning signal GOUT is maintained at the low level. Also, during this period, since the reset signal RESET is at a low level, the thin-film transistor T92 is maintained in an off state. Therefore, the potential of the netA does not decrease during this period.

When reaching the time point t1, the first clock CKA changes from the low level to the high level. In this case, because the thin-film transistor T93 is in an on state, a potential of the input terminal 93 increases and the potential of the output terminal 95 also increases. Here, as shown in FIG. 28, because the capacitor C9 is provided between the netA and the output terminal 95, the potential of the netA also increases (the netA is bootstrapped) with the increase in the potential of the output terminal 95. As a result, a large voltage is applied to the thin-film transistor T93, and the potential of the scanning signal GOUT increases to a high-level potential of the first clock CKA. Consequently, a gate bus line connected to the output terminal 95 of the bistable circuit becomes in a selected state. Note that, during a period from the time point t1 to a time point t2, the second clock CKB is at a low level. Therefore, because the thin-film transistor T94 is maintained in an off state, the potential of the scanning signal GOUT does not decrease during this period.

When reaching the time point t2, the first clock CKA changes from the high level to the low level. Accordingly, the potential of the output terminal 95 decreases with the decrease in the potential of the input terminal 93, and the potential of the netA also decreases via the capacitor C9. Moreover, at the time point t2, a pulse of the reset signal RESET is provided to the input terminal 92. Accordingly, the thin-film transistor T92 becomes in an on state. As a result, the potential of the netA changes from the high level to the low level. Moreover, at the time point t2, the second clock CKB changes from the low level to a high level. Accordingly, the thin-film transistor T94 becomes in an on state. As a result, the potential of the output terminal 95, that is, the potential of the scanning signal GOUT, becomes at the low level.

As described above, the scanning signal GOUT outputted from each stage (bistable circuit) is provided to the next stage as the set signal SET, as shown in FIG. 27. In this manner, the plural gate bus lines provided in the display device sequentially become in the selected state in each horizontal scanning period, and writing is performed to a pixel capacitance within the pixel circuit for each row.

Regarding a present invention, the following prior-art document is known. Japanese Unexamined Patent Application Publication No. 2005-50502 describes a shift register which is configured such that a scanning signal that is outputted from a (k+1)-th stage bistable circuit is used as a reset signal of a k-th stage bistable circuit.

PRIOR ART DOCUMENT

Patent Document

[Patent Document 1] Japanese Unexamined Patent Application Publication No. 2005-50502

SUMMARY OF INVENTION

Problems to be Solved by the Invention

By the way, because an ideal operation of a bistable circuit is described in the above, a length of a period from a fall of one clock to a rise of the other clock (hereinafter, referred to as a "clock fall-rise period") is assumed as 0. However, actually, a predetermined period is provided as a clock fall-rise period, as shown by a symbol Tck1 in FIG. 30. In this case, when a length of one vertical scanning period is constant, a charge time of one horizontal scanning becomes longer when a clock fall-rise period is shorter. Therefore, to suppress occurrence of a display failure attributable to a shortage of charge, preferably, a clock fall-rise period is shorter. However, when the clock fall-rise period is set shorter, there is a possibility of occurrence of an abnormal operation. This is described below.

FIG. 31 is a timing chart for describing occurrence of an abnormal operation when a clock fall-rise period is set short. When reaching a time point t0, a capacitor C9 (see FIG. 28) is charged, and a potential of the netA changes from a low level to a high level, based on a pulse of a set signal SET. After a second clock CKB changes from a high level to a low level at a time point t1a, a first clock CKA changes from a low level to a high level at a time point t1b, and the potential of the netA increases. As a result, a potential of a scanning signal GOUT increases to a high-level potential of the first clock CKA. When reaching a time point t2a, the first clock CKA changes from the high level to a low level. Accordingly, a potential of the input terminal 93 decreases. Consequently, the potential of the scanning signal GOUT gradually decreases, and the potential of the netA also decreases via the capacitor C9. When reaching a time point t2b, the pulse of the reset signal RESET is provided to the input terminal 92. Accordingly, the thin-film transistor T92 becomes in an on state, and the potential of the netA changes from the high level to the low level. At the time point t2b, the second clock CKB changes from the low level to the high level. Accordingly, the thin-film transistor T94 becomes in an on state, and the potential of the scanning signal GOUT gradually decreases. When a portion indicated by a reference numeral 96 in FIG. 31 is focused, after the time point t2a, the time point t2b comes before the potential of the scanning signal GOUT sufficiently decreases, and the potential of the netA decreases. Therefore, an effect of reduction of the potential of the scanning signal GOUT based on the change of the first clock CKA from the high level to the low level is not sufficiently obtained. Accordingly, the potential of the scanning signal GOUT does not quickly decrease to the low level. Although the potential of the scanning signal GOUT decreases by the thin-film transistor T94 becoming in an on state at the time point t2b, because the thin-film transistor T93 is larger in size than the thin-film transistor T94, an effect of reduction of the potential of the scanning signal GOUT by the thin-film transistor T94 becoming in the on state is relatively small. Consequently, when the clock fall-rise period is set short, fall of the scanning signal GOUT outputted from each bistable circuit becomes mild, unnecessary writing to a pixel capacitance is performed, and a display quality lowers.

In the shift register disclosed in Japanese Unexamined Patent Application Publication No. 2005-50502 described above, a transistor (a symbol Q3 in FIG. 3 of Japanese Unexamined Patent Application Publication No. 2005-50502) that shortens a time required for a scanning signal to fall is provided. Although a time required for the scanning signal to fall is shorted accordingly, cost increases because the transistor is required.

An object of the present invention is to shorten a clock fall-rise period while suppressing an increase in a circuit area, an increase in current consumption, and a cost increase, without generating an abnormal operation, in a shift register within a monolithic gate driver.

Means for Solving the Problems

A first aspect of the present invention is directed to a shift register comprising a plurality of bistable circuits each having a first state and a second state and connected in series with each other, in which the plurality of bistable circuits sequentially become in the first state based on at least four-phase clock signals including two-phase clock signals which are provided as a first clock signal and a second clock signal to odd-order stage bistable circuits out of the plurality of bistable circuits, and two-phase clock signals which are provided as the first clock signal and the second clock signal to even-order stage bistable circuits out of the plurality of bistable circuits, wherein
    each bistable circuit includes:
    an output node that outputs a state signal indicating either one of the first state and the second state;
    an output-control switching element in which the first clock signal is provided to a second electrode, and a third electrode is connected to the output node;
    a first-node charge unit for charging a first node connected to a first electrode of the output-control switching element based on a state signal outputted from a bistable circuit of a pre-stage or a stage before the pre-stage of each bistable circuit concerned; and
    a first-node discharge unit for discharging the first node based on a state signal outputted from a bistable circuit of a third stage after each bistable circuit concerned.

According to a second aspect of the present invention, in the first aspect of the present invention,
    a phase of the first clock signal and a phase of the second clock signal are shifted by 180 degrees from each other.

According to a third aspect of the present invention, in the first aspect of the present invention,
    a phase of two-phase clock signals provided to the odd-order stage bistable circuits and a phase of two-phase clock signals provided to the even-order stage bistable circuits are shifted by 90 degrees from each other.

According to a fourth aspect of the present invention, in the first aspect of the present invention,
    a timing when the first clock signal changes from a high level to a low level is the same as a timing when the second clock signal changes from a low level to a high level, and also a timing when the first clock signal changes from the low level to the high level is the same as a timing when the second clock signal changes from the high level to the low level.

According to a fifth aspect of the present invention, in the first aspect of the present invention,
    on-duty of each of the four-phase clock signals is 50%.

According to a sixth aspect of the present invention, in the first aspect of the present invention, in each bistable circuit, the first-node charge unit includes a first switching element in which a state signal outputted from a pre-stage bistable circuit of each bistable circuit concerned is provided to a first electrode and a second electrode, and a third electrode is connected to the first node, and the first-node discharge unit includes a second switching element in which a state signal outputted from a bistable circuit of a third stage after each bistable circuit concerned is provided to a first electrode, a second electrode is connected to the first node, and a low-level potential is provided to a third electrode.

According to a seventh aspect of the present invention, in the first aspect of the present invention, each bistable circuit further includes:

a third switching element in which a second electrode is connected to the first node, and a low-level potential is provided to a third electrode; and a second node control unit that controls a potential of a second node connected to a first electrode of the third switching element, based on the second clock signal and a potential of the first node.

According to an eighth aspect of the present invention, in the seventh aspect of the present invention, the second node control unit includes:

a fourth switching element in which the second clock signal is provided to a first electrode and a second electrode, and a third electrode is connected to the second node; and a fifth switching element in which a first electrode is connected to the first node, a second electrode is connected to the second node, and a low-level potential is provided to a third electrode.

According to a ninth aspect of the present invention, in the first aspect of the present invention, the odd-order stage bistable circuits receive one of two-phase clock signals that are provided to the even-order stage bistable circuits, as a third clock signal, the even-order stage bistable circuits receive one of two-phase clock signals that are provided to the odd-order stage bistable circuits, as the third clock signal, and each bistable circuit further includes a third switching element in which a second electrode is connected to the first node, and a low-level potential is provided to a third electrode, and a second-node control unit that controls a potential of a second node connected to a first electrode of the third switching element, based on the third clock signal and a potential of the first node.

According to a tenth aspect of the present invention, in the ninth aspect of the present invention, the second node control unit includes:

a fourth switching element in which the third clock signal is provided to a first electrode and a second electrode, and a third electrode is connected to the second node; and a fifth switching element in which a first electrode is connected to the first node, a second electrode is connected to the second node, and a low-level potential is provided to a third electrode.

According to an eleventh aspect of the present invention, in the seventh aspect of the present invention, in each bistable circuit, the second node control unit further includes a sixth switching element in which a state signal outputted from a next-stage bistable circuit of each bistable circuit concerned is provided to a first electrode, a second electrode is connected to the second node, and a low-level potential is provided to a third electrode.

According to a twelfth aspect of the present invention, in the seventh aspect of the present invention, each bistable circuit further includes a second first-node charge unit for charging the first node based on a state signal outputted from a next-stage bistable circuit of each bistable circuit concerned.

According to a thirteenth aspect of the present invention, in the twelfth aspect of the present invention, in each bistable circuit, the second first-node charge unit includes a seventh switching element in which a state signal outputted from a next-stage bistable circuit of each bistable circuit concerned is provided to a first electrode and a second electrode, and a third electrode is connected to the first node.

According to a fourteenth aspect of the present invention, in the first aspect of the present invention, each bistable circuit further includes an eighth switching element in which the second clock signal is provided to a first electrode, a second electrode is connected to the output node, and a low-level potential is provided to a third electrode.

According to a fifteenth aspect of the present invention, in the first aspect of the present invention, each bistable circuit further includes a capacitor in which one end is connected to the first node, and the other end is connected to the output node.

According to a sixteenth aspect of the present invention, in the first aspect of the present invention, each bistable circuit further includes a ninth switching element in which a state signal outputted from a bistable circuit of a second stage or a third stage after each bistable circuit concerned is provided to a first electrode, a second electrode is connected to the output node, and a low-level potential is provided to a third electrode.

According to a seventeenth aspect of the present invention, in the first aspect of the present invention, three scanning end signals for discharging the first node that is included in each of bistable circuits of a last-stage, a stage before the last stage, and a second stage before the last stage out of the plurality of bistable circuits, by the first-node discharge unit respectively, are provided from an outside.

According to an eighteenth aspect of the present invention, in the seventeenth aspect of the present invention, at least two scanning end signals out of the three scanning end signals are realized by one signal.

According to a nineteenth aspect of the present invention, in the eighteenth aspect of the present invention, in each of bistable circuits of a last-stage, a stage before the last stage, and a second stage before the last stage out of the plurality of bistable circuits, a change of the first clock signal from a low level to a high level is suppressed, during a period until the first node is discharged by the first-node discharge unit, after the first node is charged by the first-node charge unit.

According to a twentieth aspect of the present invention, in the seventeenth aspect of the present invention, any one of bistable circuits of a last-stage, a stage before the last stage, and a second stage before the last stage out of the plurality of bistable circuits includes a tenth switching element in which the scanning end signal is provided to a first electrode, a second electrode is connected to the output node, and a low-level potential is provided to a third electrode.

According to a twenty-first aspect of the present invention, in the first aspect of the present invention, the shift register is formed by using amorphous silicon.

According to a twenty-second aspect of the present invention, in the first aspect of the present invention, the shift register is formed by using microcrystalline silicon.

According to a twenty-third aspect of the present invention, in the first aspect of the present invention, the shift register is formed by using polycrystalline silicon.

According to a twenty-fourth aspect of the present invention, in the first aspect of the present invention, the shift register is formed by using an oxide semiconductor.

A twenty-fifth aspect of the present invention is directed to a scanning signal line drive circuit of a display device, for driving a plurality of scanning signal lines that are provided in a display unit, comprising:

the shift register according to the first aspect of the present invention, wherein the plurality of bistable circuits are provided so as to have a one-to-one correspondence with the plurality of scanning signal lines, and each bistable circuit provides a state signal outputted from the output node, to a scanning signal line corresponding to each bistable circuit concerned as a scanning signal.

A twenty-sixth aspect of the present invention is directed to a display device comprising the scanning signal line drive circuit according to the twenty-fifth aspect of the present invention, including the display unit.

According to a twenty-seventh aspect of the present invention, in the twenty-sixth aspect of the present invention, a shift register including the plurality of bistable circuits is provided at both one end side and the other end side of the display unit, respectively.

According to a twenty-eighth aspect of the present invention, in the twenty-sixth aspect of the present invention, the odd-order stage bistable circuits are provided at one end side of the display unit, and the even-order stage bistable circuits are provided at the other end side of the display unit.

Effects of the Invention

According to the first aspect of the present invention, each stage (bistable circuit) of the shift register is provided with the output-control switching element in which the first electrode is connected to the first node, the first clock signal is provided to the second electrode, and the third electrode is connected to the output node that outputs the state signal. Further, the four-phase clock signals including the two-phase clock signals that are provided to the odd-order stages and the two-phase clock signals that are provided to the even-order stages are provided to the shift register. In this configuration, the first node of each stage is charged based on a state signal outputted from a pre-stage or from a stage before the pre-stage, and is discharged based on a state signal outputted from a third stage after a stage concerned. Therefore, a period in which the potential of the first node is maintained at a high level becomes long, and even when a clock fall-rise period is set short, the effect of reduction of a potential of a state signal based on the first clock signal changing from a high level to a low level is sufficiently obtained. Accordingly, when this shift register is applied to a display device, after a selected period of each scanning signal line ends, the potential of the scanning signal quickly decreases to the low level. Consequently, an abnormal operation due to unnecessary writing to a pixel capacitance does not occur. Further, it is not necessary to provide a switching element that shortens a time required for a scanning signal to fall. Thus, a shift register is realized that can shorten a clock fall-rise period while suppressing an increase in a circuit area, an increase in current consumption, and a cost increase, without generating an abnormal operation.

According to the second aspect of the present invention, an effect similar to that of the first aspect is obtained.

According to the third aspect of the present invention, phases of two-phase clock signals that are provided to odd-order stages and two-phase clock signals that are provided to even-order stages are shifted by 90 degrees from each other. Therefore, a charge time to a pixel capacitance is uniformized, and occurrence of a display failure attributable to a charge difference is suppressed.

According to the fourth aspect of the present invention, because the change timing of the first clock signal and the change timing of the second clock signal become the same, noise of the state signal outputted from the bistable circuit is reduced. Further, because a charge time to a pixel capacitance becomes long, occurrence of a display failure attributable to a charge shortage is effectively suppressed.

According to the fifth aspect of the present invention, on-duty of each clock signal is 50%. Therefore, it is possible to provide a period when plural scanning signal lines are simultaneously selected. In this case, preliminary charge (pre-charge) is performed to a pixel capacitance during a first half period of the period when each scanning signal line is being selected, and main charge is performed to a pixel capacitance during a latter half period. Therefore, a sufficient charge time is secured, and lowering of the display quality attributable to a shortage of charge to a pixel capacitance is suppressed.

According to the sixth aspect of the present invention, an effect that is similar to that of the first aspect of the present invention is obtained in the configuration that the switching element is included in the first-node charge unit and a first-node discharge unit.

According to the seventh aspect of the present invention, during the period when the potential of the first node is at the low level, the potential of the second node for controlling the potential of the first node can be set to a high level every predetermined period. Accordingly, during the period when the potential of the first node is at the low level, the third switching element becomes in an on state every predetermined period. Consequently, even when a shift of a threshold voltage of the output-control switching element occurs due to high-temperature aging and a leakage current in the switching element becomes large, for example, the potential of the first node can be securely set to the low level every predetermined period, and output of an abnormal pulse from the output node can be suppressed.

According to the eighth aspect of the present invention, an effect similar to that of the seventh aspect of the present invention is obtained, in a configuration that the switching element is included in the second node control unit.

According to the ninth aspect of the present invention, even when the shift of the threshold voltage of the output-control switching element occurs due to high-temperature aging and the leakage current in the switching element becomes large, for example, the potential of the first node can be securely set to the low level every predetermined period, and output of the abnormal pulse from the output node can be suppressed, in a similar manner to that of the seventh aspect of the present invention.

According to the tenth aspect of the present invention, an effect similar to that of the ninth aspect of the present invention is obtained, in a configuration that the switching element is included in the second node control unit.

According to the eleventh aspect of the present invention, in each stage of the shift register, during a period when the potential of the first node is to be maintained at a high level, reduction of the potential of the first node can be suppressed by setting a potential of the second node to a low level. Accordingly, the potential of the state signal can be securely decreased to the low level corresponding to the change of the first clock signal from the high level to the low level.

According to the twelfth aspect of the present invention, in each stage of the shift register, even when the second node is in a floating state during the period when the potential of the first node is to be maintained at the high level, the potential of the first node can be securely maintained at the high level based on the state signal outputted from the next-stage bistable circuit. Accordingly, the potential of the state signal can be securely decreased to the low level corresponding to the change of the first clock signal from the high level to the low level.

According to the thirteenth aspect of the present invention, the effect that is similar to that of the ninth aspect of the present invention is obtained in the configuration that the switching element is included in the second first-node charge unit.

According to the fourteenth aspect of the present invention, even when an off-leak occurs in the output-control switching element, because the potential of the output node becomes at a low level based on the second clock signal, output of an abnormal pulse from the output node can be effectively suppressed.

According to the fifteenth aspect of the present invention, when the potential of the output node increases, the potential of the first node increases via the capacitor (the first node is bootstrapped). Therefore, during the period when the bistable circuit needs to be maintained in the first state, reduction of the potential of the first node is suppressed, and a large voltage is provided to the first electrode of the output-control switching element. Accordingly, the waveform of the state signal outputted from the output node is stabilized.

According to the sixteenth aspect of the present invention, because the potential of the output node is set to the low level based on the state signal outputted from the second stage after each stage or from the third stage after each stage, the potential of the state signal can be more securely decreased to the low level.

According to the seventeenth aspect of the present invention, the first nodes of the last stage, the stage before the last stage, and the second stage before the last stage are discharged by the scanning end signal provided from the outside.

According to the eighteenth aspect of the present invention, the first nodes of at least two stages of the last stage, the stage before the last stage, and the second stage before the last stage are discharged based on the same signal. Therefore, the signal wirings that are necessary to discharge the first nodes are decreased, and an effect of reduction of a circuit area, reduction of current consumption, and cost reduction is enhanced.

According to the nineteenth aspect of the present invention, an unnecessary increase in the potential of the first node is suppressed in the last stage, the stage before the last stage, and the second stage before the last stage, and lowering of the display quality is suppressed.

According to the twentieth aspect of the present invention, the potential of the state signal can be set to the low level based on the scanning end signal, in the last stage, the stage before the last stage, and the second stage before the last stage.

According to the twenty-first aspect of the present invention, the effect that is similar to that of any one of the first to seventeenth aspects of the present invention is obtained, in a shift register that is formed by using amorphous silicon.

According to the twenty-second aspect of the present invention, an effect similar to that of the first aspect of the present invention is obtained, in the shift register formed by using microcrystalline silicon.

According to the twenty-third aspect of the present invention, an effect similar to that of the first aspect of the present invention is obtained, in the shift register formed by using polycrystalline silicon.

According to the twenty-fourth aspect of the present invention, an effect similar to that of the first aspect of the present invention is obtained, in the shift register formed by using an oxide semiconductor.

According to the twenty-fifth aspect of the present invention, the scanning signal line drive circuit including the shift register capable of obtaining an effect similar to that of the first aspect of the present invention is realized.

According to the twenty-sixth aspect of the present invention, the display device including the scanning signal line drive circuit capable of obtaining an effect similar to that of the twenty-fifth aspect of the present invention is realized.

According to the twenty-seventh aspect of the present invention, charge is performed to one scanning signal line from the both sides of the display unit. Therefore, lowering of the display quality attributable to a charge shortage is suppressed.

According to the twenty-eighth aspect of the present invention, a size per one stage of the shift register can be set to substantially a half size, in comparison with a size in a configuration that the bistable circuit constituting the shift register is provided at only one side of the display unit. Accordingly, an area that is necessary as a picture-frame of a panel can be reduced, and reduction in sizes of various products can be realized.

MODES FOR CARRYING OUT THE INVENTION

Hereinafter, embodiments of the present invention are described with reference to the accompanying drawings. Note that, in the following description, a gate terminal (gate electrode) of a thin-film transistor corresponds to a first electrode, a drain terminal (drain electrode) corresponds to a second electrode, and a source terminal (source electrode) corresponds to a third electrode.

1. First Embodiment

1.1 An Overall Configuration and an Operation

Figure 2:
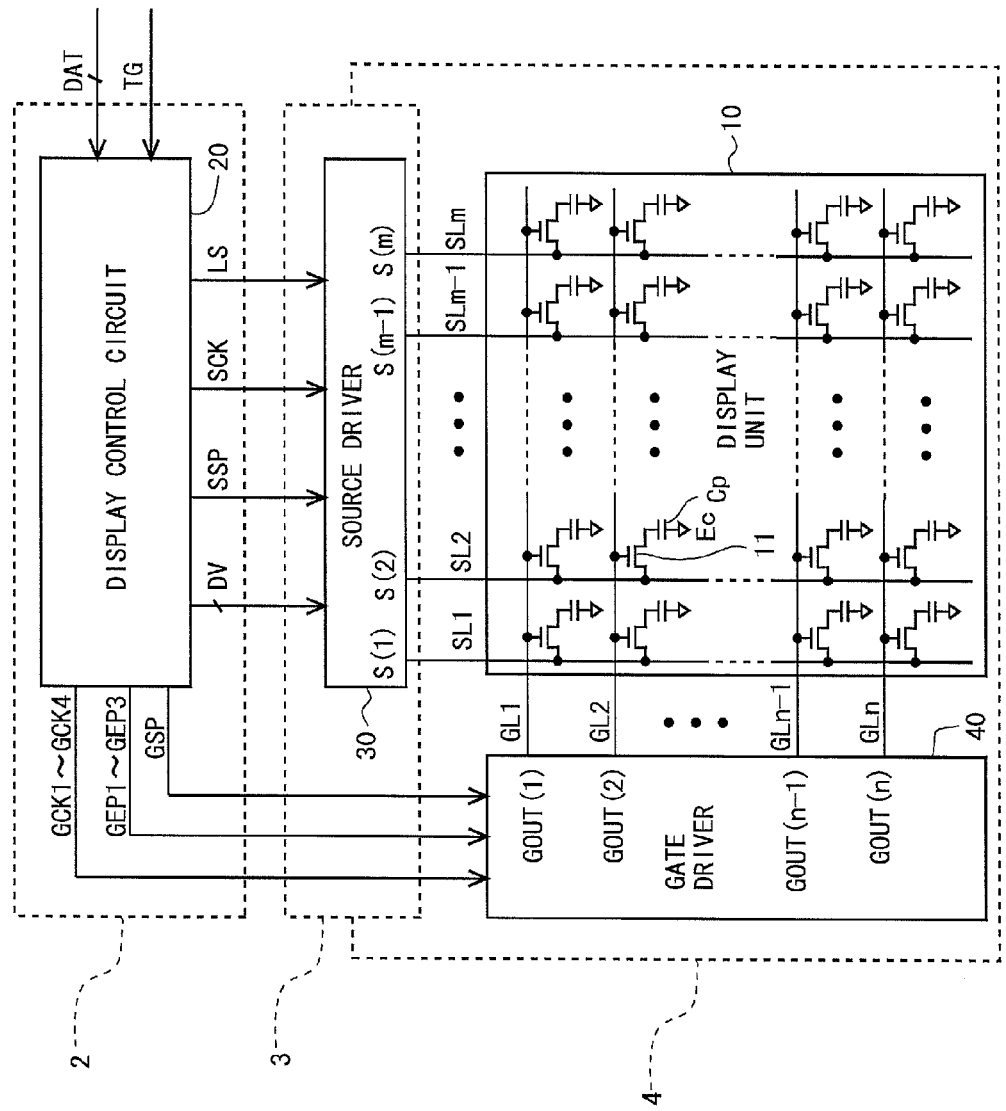
FIG. 2 is a block diagram showing an overall configuration of a liquid crystal display device in the first embodiment.

FIG. 2 is a block diagram showing an overall configuration of an active matrix-type liquid crystal display device according to a first embodiment of the present invention. As shown in FIG. 2, this liquid crystal display device includes a display unit 10, a display control circuit 20, a source driver (video signal line drive circuit) 30, and a gate driver (scanning signal line drive circuit) 40. The display control circuit 20 is formed on a control substrate 2. The source driver 30 is formed on a flexible substrate 3. The gate driver 40 is formed on a display panel 4 that includes the display unit 10, by using amorphous silicon, polycrystalline silicon, microcrystalline silicon, an oxide semiconductor (IGZO, for example), and the like. In other words, in the present embodiment, the gate driver 40 is monolithically configured.

The display unit 10 includes plural (m) source bus lines (video signal lines) SL1 to SLm, plural (n) gate bus lines (scanning signal lines) GL1 to GLn, and plural (n×m) pixel formation portions that are provided corresponding to intersections between the source bus lines SL1 to SLm and the gate bus lines GL1 to GLn, respectively.

The plural pixel formation portions are arranged in a matrix form and constitute a pixel array. Each pixel formation portion includes a thin-film transistor (TFT) 11 that is a switching element in which a gate terminal is connected to a gate bus line that passes a corresponding intersection and a source terminal is connected to a source bus line that passes the corresponding intersection, a pixel electrode connected to the drain terminal of the thin-film transistor 11, a common electrode Ec that is a counter electrode provided so as to be shared by the plural pixel formation portions, and a liquid crystal layer that is provided so as to be shared by the plural pixel formation portions and that is sandwiched between the pixel electrode and the common electrode Ec. A pixel capacitance Cp is configured by a liquid crystal capacitance formed by the pixel electrode and the common electrode Ec. Note that usually, auxiliary capacitances are provided in parallel with the liquid crystal capacitance, to securely hold a voltage in the pixel capacitance Cp. However, because the auxiliary capacitances are not directly related to the present invention, the description and depiction thereof are omitted.

The display control circuit 20 receives a timing signal group TG such as a horizontal synchronization signal and a vertical synchronization signal, and an image signal DAT, which are transmitted from the outside, and outputs a digital video signal DV, and a source start pulse signal SSP, a source clock signal SCK, a latch strobe signal LS, a gate start pulse signal GSP, first to third gate end pulse signals (scanning end signals) GEP1 to GEP3, and first to fourth gate clock signals GCK1 to GCK4, for controlling an image display in the display unit 10.

The source driver 30 receives the digital video signal DV, the source start pulse signal SSP, the source clock signal SCK, and the latch strobe signal LS that are outputted from the display control circuit 20, and applies driving video signals S(1) to S(m) to the source bus lines SL1 to SLm, respectively.

The gate driver 40 repeats application of active scanning signals GOUT(1) to GOUT(n) to the gate bus lines GL1 to GLn, in cycles of one vertical scanning period, based on the gate start pulse signal GSP, the first to third gate end pulse signals GEP1 to GEP3, and the first to fourth gate clock signals GCK1 to GCK4 that are outputted from the display control circuit 20. Note that the gate driver 40 is described in detail later.

In a manner as described above, the driving video signals S(1) to S(m) are applied to the source bus lines SL1 to SLm, respectively, and the scanning signals GOUT(1) to GOUT(n) are applied to the gate bus lines GL1 to GLn, respectively, so that an image based on the image signal DAT transmitted from the outside is displayed on the display unit 10.

1.2. A Configuration of the Gate Driver

Figure 3:
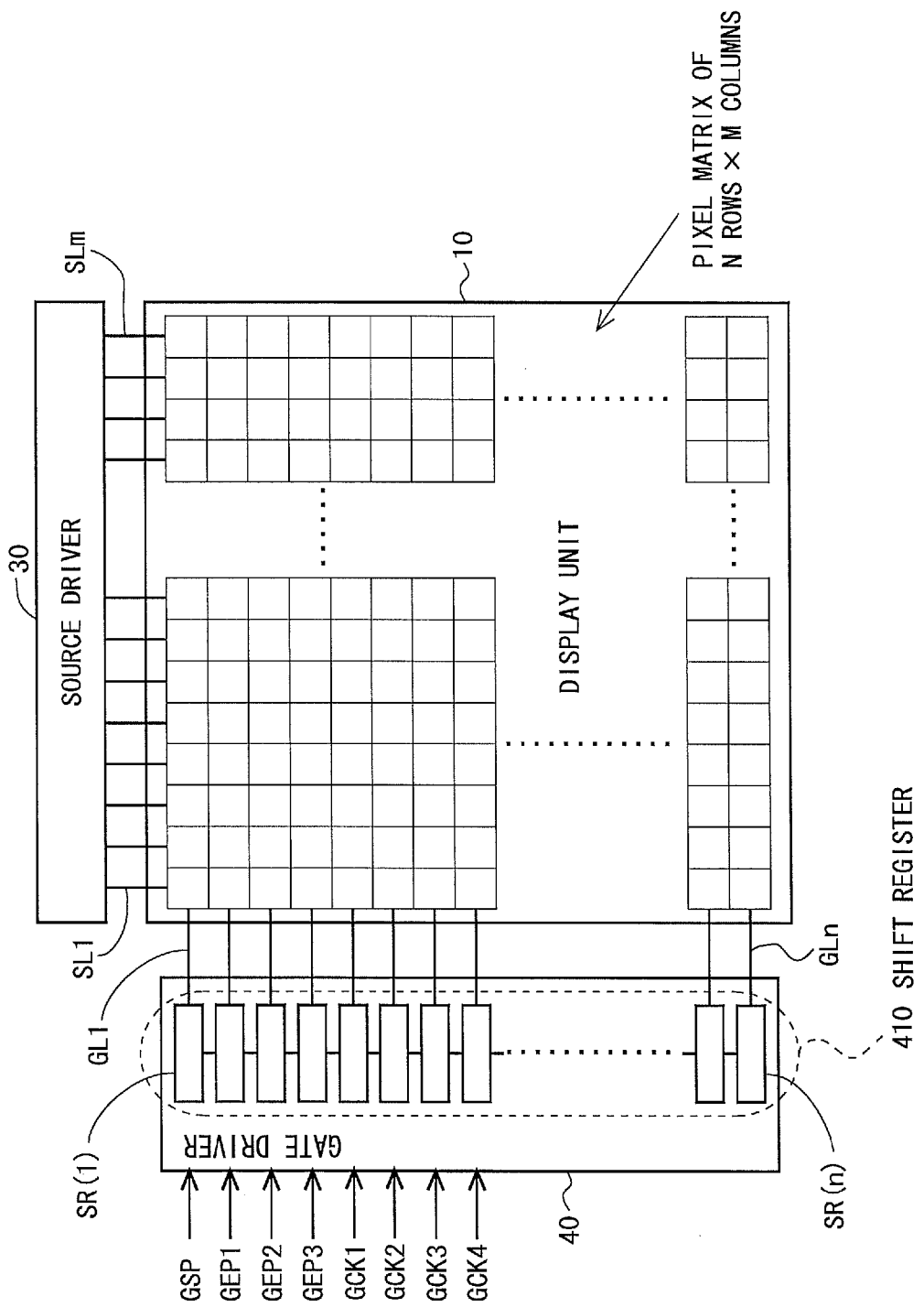
FIG. 3 is a block diagram for describing a configuration of a gate driver in the first embodiment.
Figure 4:
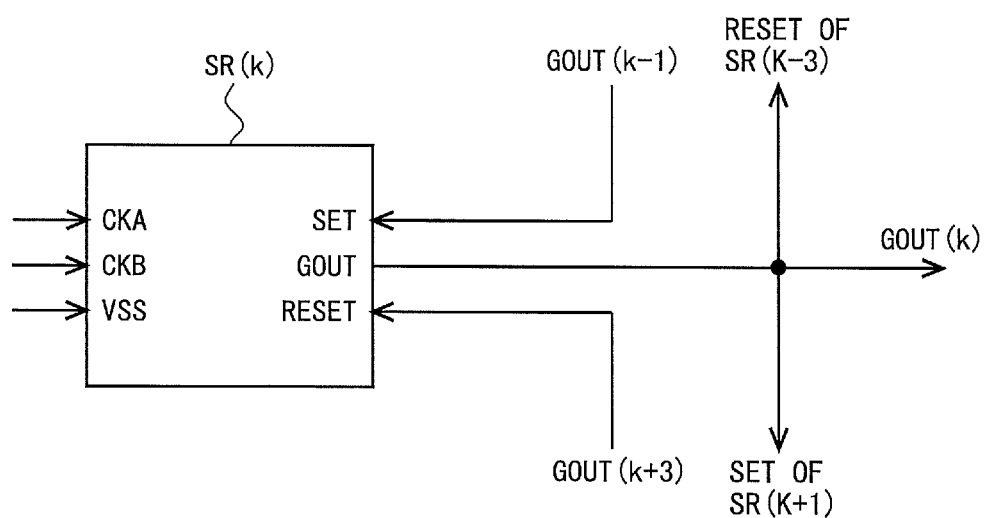
FIG. 4 is a diagram for describing input/output signals of a k-th stage bistable circuit of a shift register in the first embodiment.

A configuration of the gate driver 40 according to the present embodiment is described below with reference to FIGS. 1, 3, and 4. As shown in FIG. 3, the gate driver 40 is configured by a shift register 410 having n stages. A pixel matrix of n rows×m columns is formed in the display unit 10, and the stages of the shift register 410 are provided so as to have a one-to-one correspondence with the rows of the pixel matrix. In addition, each stage of the shift register 410 is a bistable circuit that is in either one of two states (a first state and a second state) at each time point, and that outputs a signal (state signal) indicating this state as a scanning signal. In this way, the shift register 410 is configured by n bistable circuits SR(1) to SR(n). Note that, in the present embodiment, when a bistable circuit is in the first state, the bistable circuit outputs a state signal of a high level (H level) as a scanning signal, and when a bistable circuit is in the second state, the bistable circuit outputs a state signal of a low level (L level) as a scanning signal. The following description is made by assuming that the shift register 410 is configured by eight bistable circuits SR(1) to SR(8).

Figure 1:
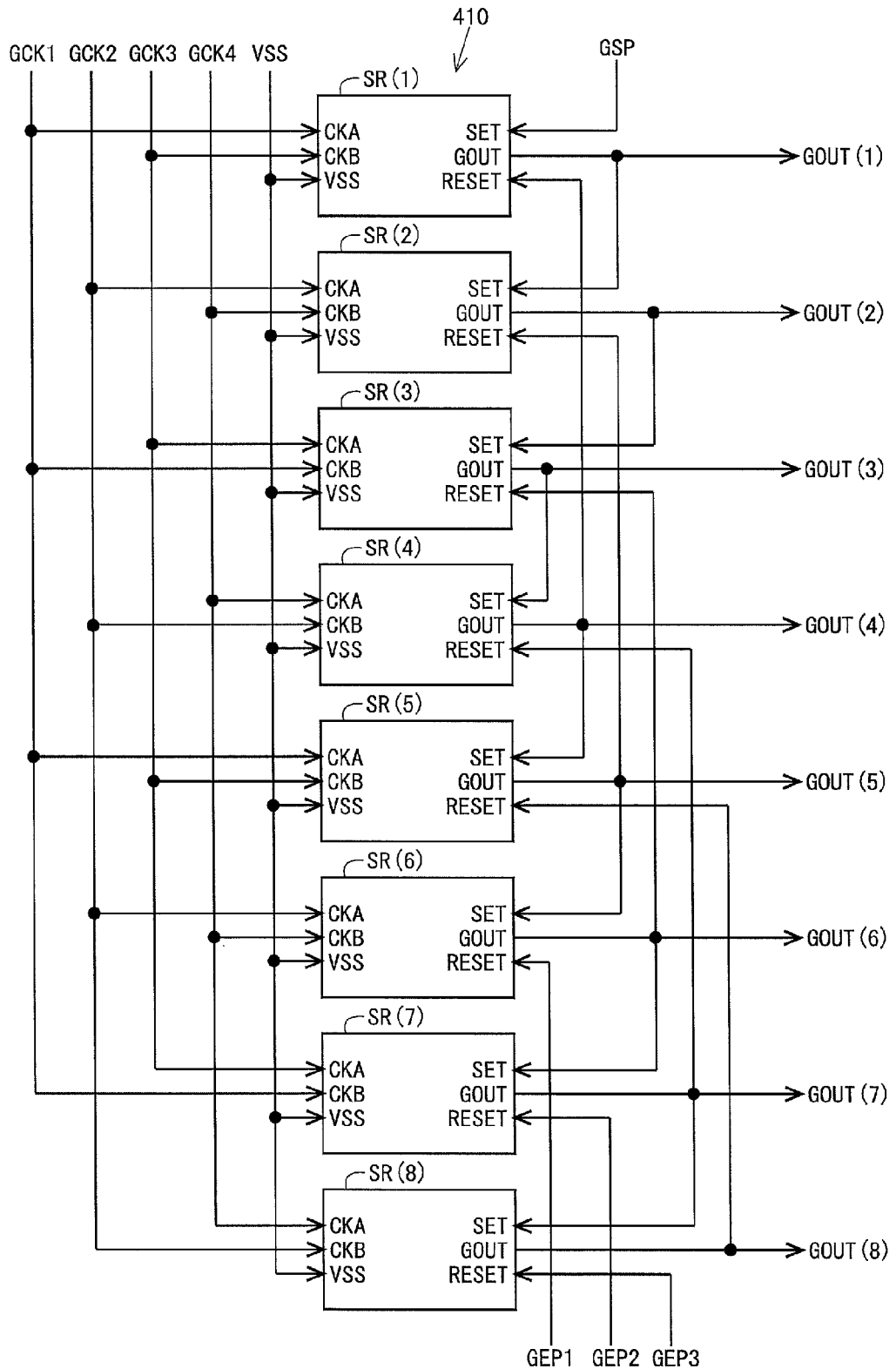
FIG. 1 is a block diagram showing a configuration of a shift register within a gate driver of an active matrix-type liquid crystal display device according to a first embodiment of the present invention.

FIG. 1 is a block diagram showing configuration of the shift register 410 within the gate driver 40. Moreover, FIG. 4 is a diagram for describing input/output signals of a k-th stage bistable circuit SR(k) of the shift register 410. As shown in FIG. 1, the shift register 410 is configured by eight bistable circuits SR(1) to SR(8). Each bistable circuit is provided with input terminals for receiving two-phase clock signals CKA (hereinafter, referred to as a "first clock") and CKB (hereinafter, referred to as a "second clock") respectively, an input terminal for receiving a low-level power source voltage VSS, an input terminal for receiving a set signal SET as a scanning starting signal, an input terminal for receiving a reset signal RESET as a scanning ending signal, and an output terminal for outputting a scanning signal GOUT.

Signals provided to input terminals of each stage (each bistable circuit) are described below. Note that as shown in FIG. 1, the low-level power source voltage VSS is commonly provided to all stages SR(1) to SR(8).

The first clock CKA and the second clock CKB are provided as follows (see FIG. 1). In the first stage SR(1), the first gate clock signal GCK1 is provided as the first clock CKA, and the third gate clock signal GCK3 is provided as the second clock CKB. In the second stage SR(2), the second gate clock signal GCK2 is provided as the first clock CKA, and the fourth gate clock signal GCK4 is provided as the second clock CKB. In the third stage SR(3), the third gate clock signal GCK3 is provided as the first clock CKA, and the first gate clock signal GCK1 is provided as the second clock CKB. In the fourth stage SR(4), the fourth gate clock signal GCK4 is provided as the first clock CKA, and the second gate clock signal GCK2 is provided as the second clock CKB. The fifth stage SR(5) to the eighth stage SR(8) have configurations that are similar to those of the first stage SR(1) to the fourth stage SR(4) described above.

The set signal SET and the reset signal RESET are as follows. Focusing attention on the k-th stage SR(k), a pre-stage scanning signal GOUT(k−1) is provided as the set signal SET, and a scanning signal GOUT(k+3) of a third stage after a stage concerned is provided as the reset signal RESET (see FIG. 4). However, the gate start pulse signal GSP is provided to the first stage SR(1) as the set signal SET, the first gate end pulse signal GEP1 is provided to the sixth stage SR(6) as the reset signal RESET, the second gate end pulse signal GEP2 is provided to the seventh stage SR(7) as the reset signal RESET, and the third gate end pulse signal GEP3 is provided to the eighth stage (last stage) SR(8) as the reset signal RESET (see FIG. 1).

A signal outputted from an output terminal of each stage (each bistable circuit) is described next. A scanning signal GOUT(k) for setting a k-th row gate bus line GLk to a selected state is outputted from the output terminal of the k-th stage SR(k). The scanning signal GOUT(k) is provided to the (k−3)-th stage as the reset signal RESET, and is provided to the (k+1)-th stage as the set signal SET (see FIG. 4).

1.3 A Configuration of the Bistable Circuit

Figure 5:
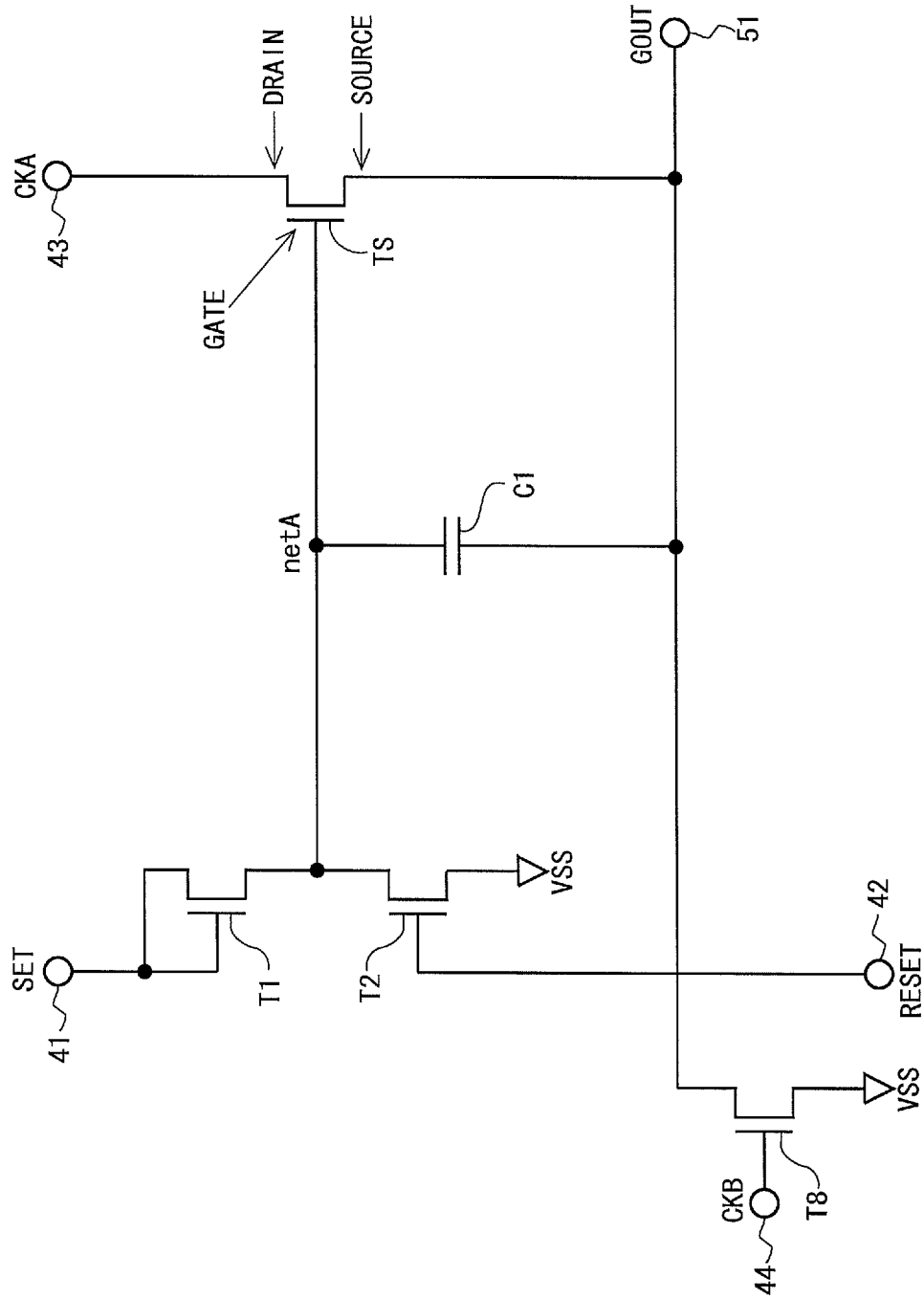
FIG. 5 is a circuit diagram showing a configuration of a bistable circuit included in the shift register in the first embodiment.
Figure 28:
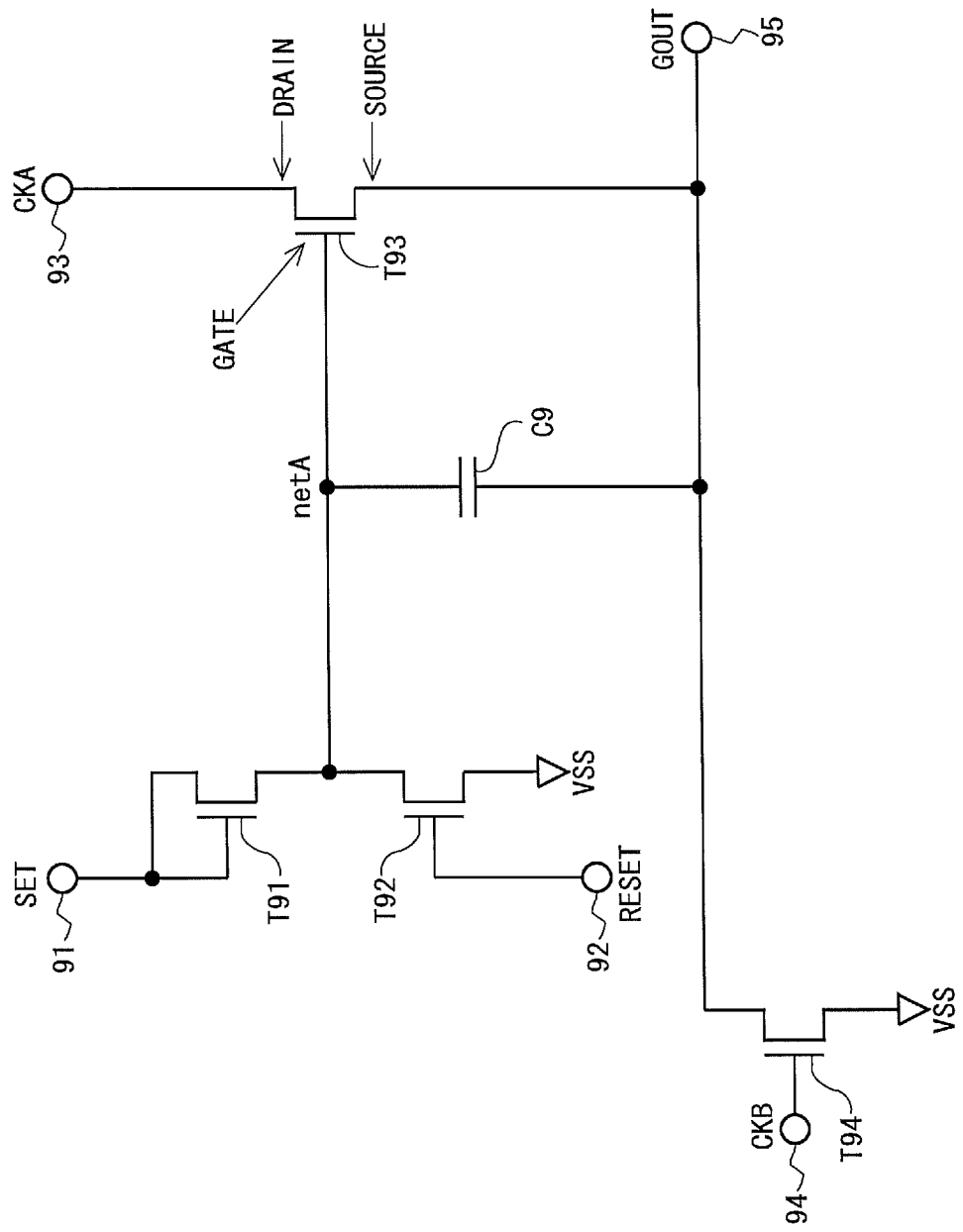
FIG. 28 is a circuit diagram showing an example of a configuration of one stage of a shift register that constitutes the gate driver in the conventional example.
Figure 29:
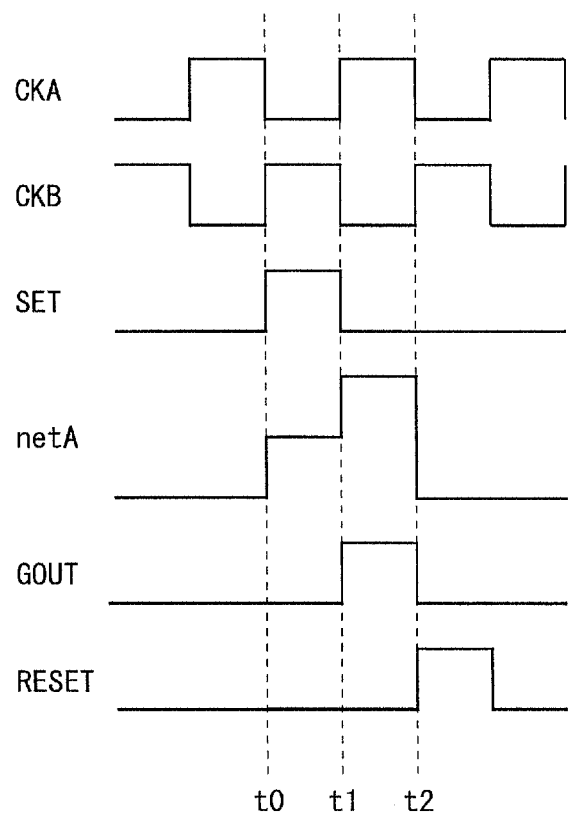
FIG. 29 is a timing chart for describing an operation of each stage of the shift register in the conventional example.
Figure 30:
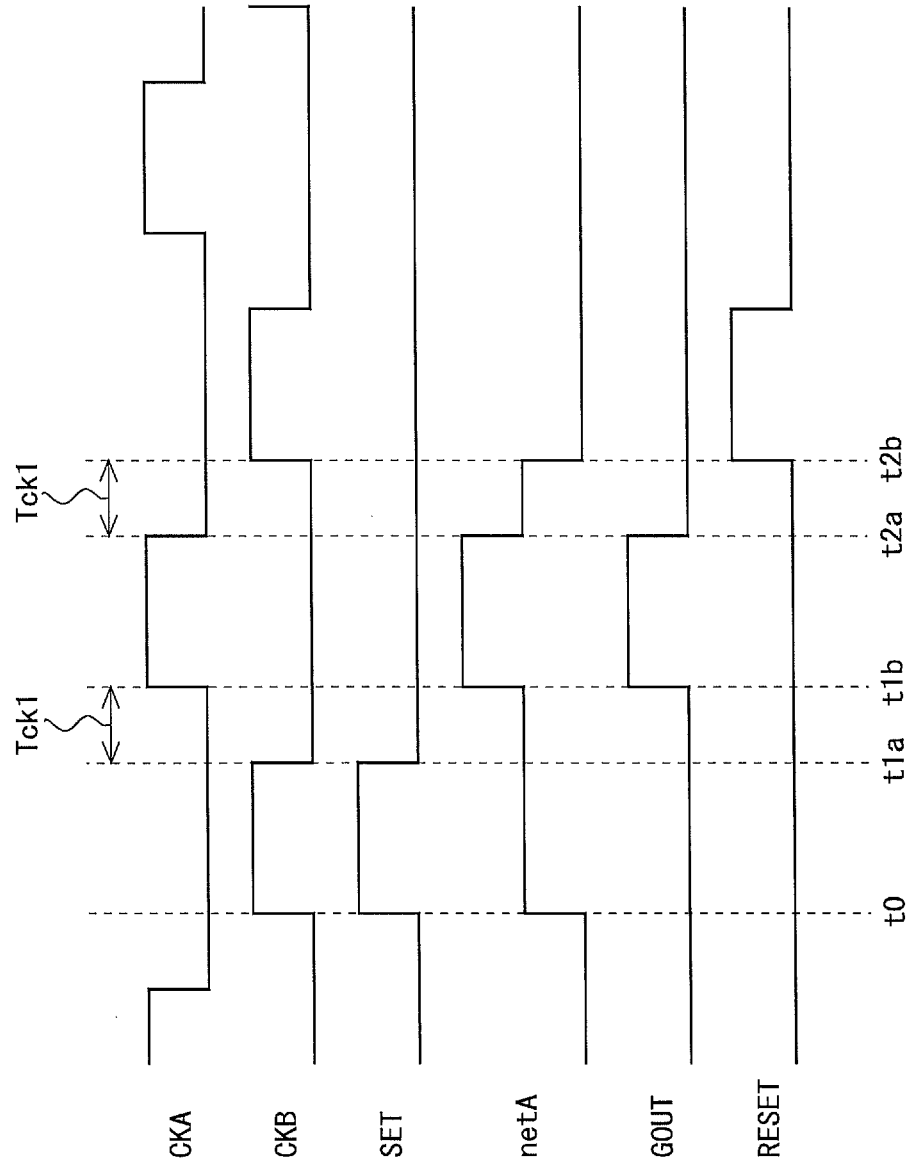
FIG. 30 is a timing chart for describing a clock fall-rise period.
Figure 31:
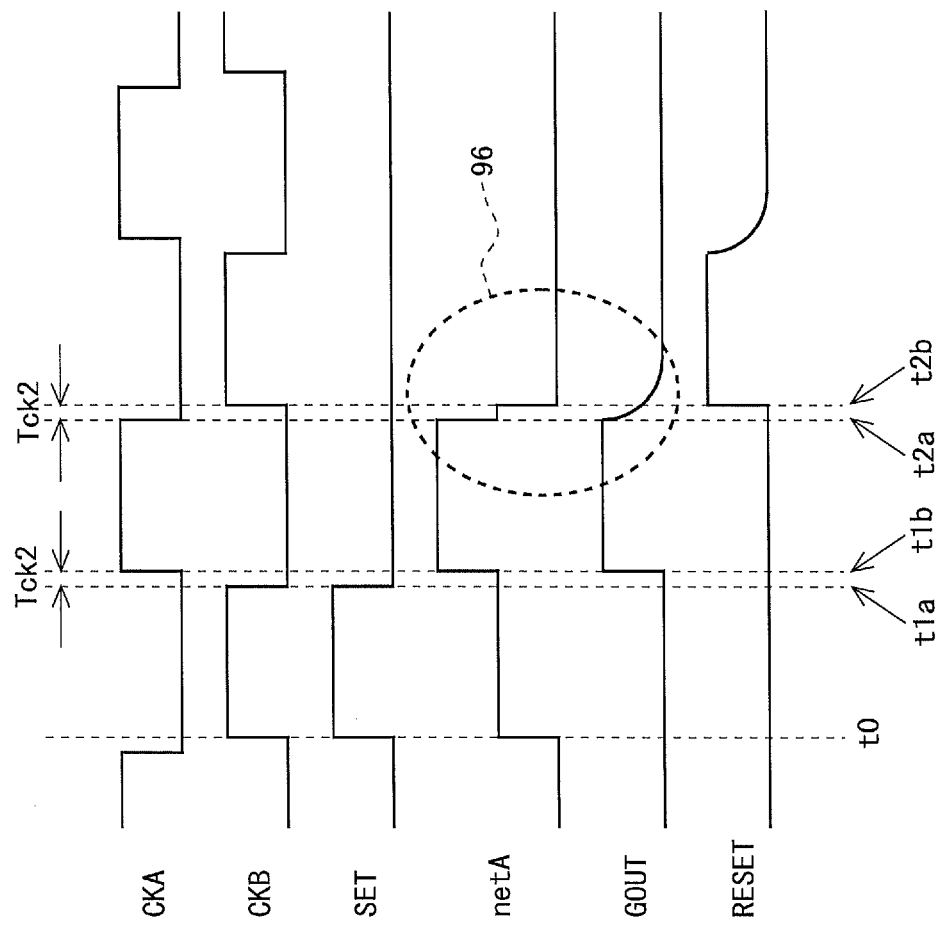
FIG. 31 is a timing chart for describing occurrence of an abnormal operation when a clock fall-rise period is set short in the conventional example.

FIG. 5 is a circuit diagram showing a configuration of the bistable circuit (a configuration of one stage of the shift register 410) included in the shift register 410 described above. This bistable circuit has a configuration similar to that of the conventional bistable circuit shown in FIG. 28. This bistable circuit includes four thin-film transistors TS (output-control switching element), T1 (first switching element), T2 (second switching element), and T8 (eighth switching element), and a capacitor C1. Further, this bistable circuit includes four input terminals 41 to 44 and one output terminal (output node) 51, in addition to the input terminal for the low-level power source voltage VSS. Herein, a reference numeral 41 is attached to an input terminal that receives the set signal SET, a reference numeral 42 is attached to an input terminal that receives the reset signal RESET, a reference numeral 43 is attached to an input terminal that receives the first clock signal CKA, and a reference numeral 44 is attached to an input terminal that receives the second clock signal CKB. Connection relationships between constituent elements within this bistable circuit are described below.

A source terminal of the thin-film transistor T1, a drain terminal of the thin-film transistor T2, and a gate terminal of the thin-film transistor TS are connected to each other. Note that, a region (wiring) in which these terminals are connected to each other is called a "netA" (first node), for convenience.

In the thin-film transistor T1, a gate terminal and a drain terminal are connected to the input terminal 41 (that is, in a diode connection), and the source terminal is connected to the netA. In the thin-film transistor T2, a gate terminal is connected to the input terminal 42, the drain terminal is connected to the netA, and a source terminal is connected to the power source voltage VSS. In the thin-film transistor TS, the gate terminal is connected to the netA, a drain terminal is connected to the input terminal 43, and a source terminal is connected to the output terminal 51. In the thin-film transistor T8, a gate terminal is connected to the input terminal 44, a drain terminal is connected to the output terminal 51, and a source terminal is connected to the power source voltage VSS. In the capacitor C1, one end is connected to the netA, and the other end is connected to the output terminal 51.

Functions of constituent elements in this bistable circuit are described next. The thin-film transistor T1 sets a potential of the netA to a high level, when the set signal SET is at a high level. The thin-film transistor T2 sets a potential of the netA to a low level, when the reset signal RESET is at a high level. The thin-film transistor TS provides a potential of the first clock CKA to the output terminal 51, when a potential of the netA is at a high level. The thin-film transistor T8 sets a potential of the scanning signal GOUT (a potential of the output terminal 51) to a low level, when the second clock CKB is at a high level. The capacitor C1 functions as a compensation capacitance for maintaining a potential of the netA at a high level during a period when a gate bus line connected to this bistable circuit is in a selected state. Note that in the present embodiment, a first-node charge unit is realized by the thin-film transistor T1, and a first-node discharge unit is realized by the thin-film transistor T2.

1.4 An Operation of the Shift Register

1.4.1 An Operation of Each Stage (Bistable Circuit)

Figure 6:
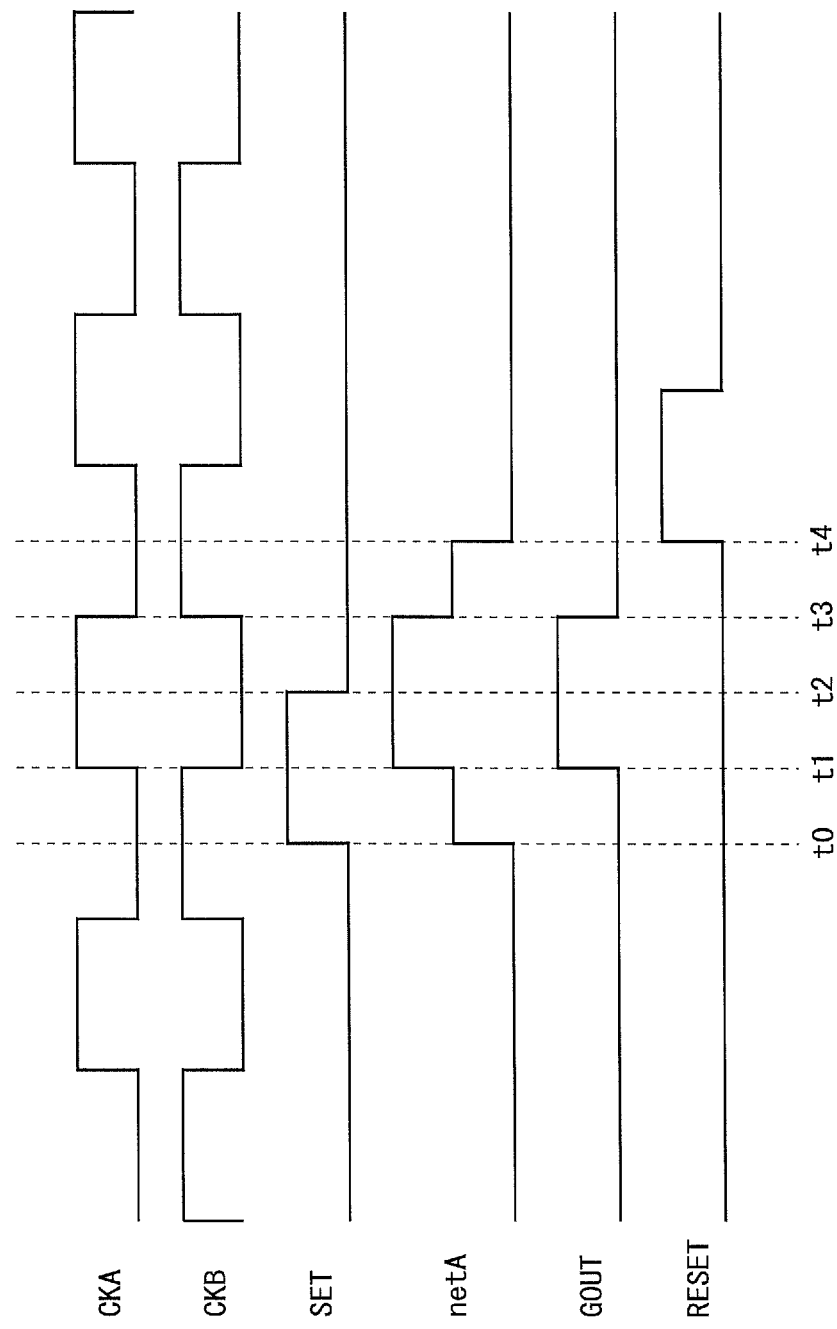
FIG. 6 is a timing chart for describing an operation of each stage of the shift register in the first embodiment.

An operation of each stage (bistable circuit) of the shift register 410 is described with reference to FIGS. 5 and 6. In the following description, it is assumed that a period from a time point t1 to a time point t3 in FIG. 6 is a period (selected period) during which a gate bus line connected to the output terminal 51 of the bistable circuit is to be placed in a selected state. Note that, a period from the time point t1 to the time point t2 is a period for preliminary charge (precharge) to a pixel capacitance, and a period from the time point t2 to a time point t3 is a period for primary charge (main charge) to the pixel capacitance. Moreover, to facilitate explanation, the length of the clock fall-rise period is set to 0.

As shown in FIG. 6, during an operation of the liquid crystal display device, the first clock CKA is provided to the input terminal 43, and the second clock CKB is provided to the input terminal 44. In this way, in the present embodiment, two-phase clock signals of which phases are shifted by 180 degrees from each other are provided to the bistable circuit.

During a period before a time point t0, the potential of the netA and the potential of the scanning signal GOUT (the potential of the output terminal 51) are at the low level. When reaching the time point t0, a pulse of the set signal SET is provided to the input terminal 41. Because the thin-film transistor T1 is in a diode connection as shown in FIG. 5, the thin-film transistor T1 becomes in an on state by the pulse of the set signal SET, and the capacitor C1 is charged. Accordingly, the potential of the netA changes from the low level to the high level, and the thin-film transistor TS becomes in an on state. During a period from the time point t0 to the time point t1, the first clock CKA is at the low level. Therefore, during this period, the scanning signal GOUT is maintained at the low level.

When reaching the time point t1, the first clock CKA changes from the low level to the high level. At this time, because the thin-film transistor TS is in the on state, the potential of the output terminal 51 increases with an increase in the potential of the input terminal 43. In this case, because the capacitor C1 is provided between the netA and the output terminal 51 as shown in FIG. 5, the potential of the netA also increases (the netA is bootstrapped) with the increase in the potential of the output terminal 51. As a result, a large voltage is applied to the thin-film transistor TS, and the potential of the scanning signal GOUT increases to the high-level potential of the first clock CKA. Consequently, a gate bus line connected to the output terminal 51 of this bistable circuit becomes in a selected state.

When reaching the time point t2, the set signal SET changes from the high level to the low level. Accordingly, the thin-film transistor T1 becomes in an off state. At this time, because the potential of the netA is maintained by the capacitor C1, the potential of the netA does not vary due to the thin-film transistor T1 becoming in an off state.

When reaching the time point t3, the first clock CKA changes from the high level to the low level. Accordingly, the potential of the output terminal 51 decreases with the decrease in the potential of the input terminal 43, and the potential of the netA also decreases via the capacitor C1. Note that, because the potential of the netA decreases by only about a decrease of the potential of the output terminal 51, the potential of the netA does not decrease to a low level and is maintained at a high level. Further, at the time point t3, the second clock CKB changes from the low level to the high level. Accordingly, the thin-film transistor T8 becomes in an on state. Thus, the potential of the output terminal 51, that is, the potential of the scanning signal GOUT, quickly becomes at the low level.

When reaching the time point t4, a pulse of the reset signal RESET is provided to the input terminal 42. Accordingly, the thin-film transistor T2 becomes in an on state, and the potential of the netA changes from the high level to the low level.

During the period before the time point t4, because the reset signal RESET is at the low level, the thin-film transistor T2 is maintained in the off state. Therefore, the potential of the netA does not decrease to a low level during the period from the time point t0 to the time point t4. Further, during the period from the time point t1 to the time point t3, because the second clock CKB is at the low level, the thin-film transistors T8 is maintained in an off state. Therefore, the potential of the scanning signal GOUT does not decrease to a low level during this period.

1.4.2 An Overall Operation of the Shift Register

Figure 7:
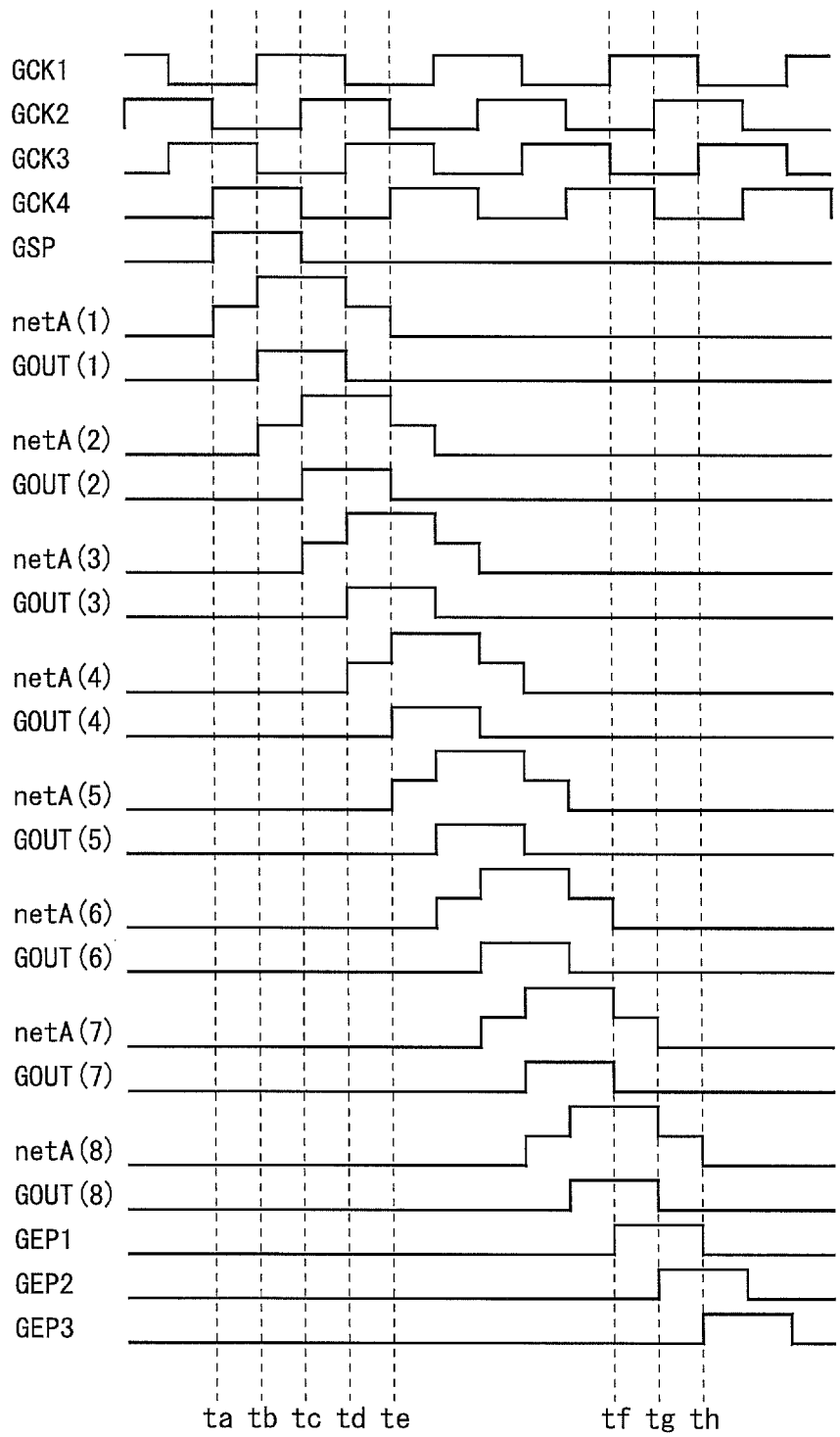
FIG. 7 is a timing chart for describing an overall operation of the shift register in the first embodiment.

An overall operation of the shift register 410 based on the operation of each stage (bistable circuit) described above is described next with reference to FIGS. 1, 5, and 7. During an operation of the liquid crystal display device, as shown in FIG. 7, the first to fourth gate clock signals GCK1 to GCK4 are provided to the shift register 410. Based on the first gate clock signal GCK1, a phase of the second gate clock signal GCK2 is late by 90 degrees, a phase of the third gate clock signal GCK3 is late by 180 degrees, and a phase of the fourth gate clock signal GCK4 is late by 270 degrees.

During a period before a time point ta, a potential of the netA is at a low level in all stages, and a potential of the scanning signal GOUT outputted from all stages is at a low level. When reaching the time point ta, a pulse of the gate start pulse signal GSP is provided to this shift register 410. The gate start pulse signal GSP is provided to the first stage SR(1) as the set signal SET, as shown in FIG. 1. Accordingly, the potential of the netA of the first stage SR(1) changes from the low level to the high level.

When reaching a time point tb, the first gate clock signal GCK1 changes from the low level to a high level. At this time, because the potential of the input terminal 43 (see FIG. 5) changes from the low level to the high level in the first stage SR(1), the potential of the netA of the first stage SR(1) further increases. As a result, the scanning signal GOUT(1) outputted from the first stage SR(1) becomes at a high level. As shown in FIG. 1, the scanning signal GOUT(1) that is outputted from the first stage SR(1) is provided to the second stage SR(2) as the set signal SET. Accordingly, the potential of the netA of the second stage SR(2) changes from the low level to the high level.

When reaching a time point tc, the second gate clock signal GCK2 changes from the low level to the high level. At this time, because the potential of the input terminal 43 changes from the low level to the high level in the second stage SR(2), the potential of the netA of the second stage SR(2) further increases. As a result, the scanning signal GOUT(2) outputted from the second stage SR(2) becomes at a high level. As shown in FIG. 1, the scanning signal GOUT(2) outputted from the second stage SR(2) is provided to the third stage SR(3) as the set signal SET. Accordingly, the potential of the netA of the third stage SR(3) changes from the low level to the high level. At the time point tc, the potentials of the first gate clock signal GCK1 and the third gate clock signal GCK3 that are provided to the first stage SR(1) do not change. Therefore, in the first stage SR(1), for the potential of the netA and the potential of the scanning signal GOUT, the potentials at the time point tb to the time point tc are maintained.

When reaching a time point td, the first gate clock signal GCK1 changes from the high level to the low level. Accordingly, the potential of the netA of the first stage SR(1) decreases. At the time point td, the third gate clock signal GCK3 changes from the low level to the high level. Accordingly, the potential of the netA of the third stage SR(3) further increases, and the scanning signal GOUT(3) outputted from the third stage SR(3) becomes at a high level. The scanning signal GOUT(3) outputted from the third stage SR(3) is provided to the fourth stage SR(4) as the set signal SET, as shown in FIG. 1. Accordingly, the potential of the netA of the fourth stage SR(4) changes from the low level to the high level. Note that, for the potential of the netA and the potential of the scanning signal GOUT, the potentials at the time point tc to the time point td are maintained, in the second stage SR(2).

When reaching a time point te, the second gate clock signal GCK2 changes from the high level to the low level. Accordingly, the potential of the netA of the second stage SR(2) decreases. At the time point te, the fourth gate clock signal GCK4 changes from the low level to the high level. Accordingly, the potential of the netA of the fourth stage SR(4) further increases, and the scanning signal GOUT(4) outputted from the fourth stage SR(4) becomes at the high level. The scanning signal GOUT(4) outputted from the fourth stage SR(4) is provided to the first stage SR(1) as the reset signal RESET and provided to the fifth stage SR(5) as the set signal SET, as shown in FIG. 1. Accordingly, the potential of the netA of the first stage SR(1) changes from the high level to the low level and the potential of the netA of the fifth stage SR(5) changes from the low level to the high level.

In a manner as described above, the scanning signals GOUT(1) to GOUT(8) are sequentially set to the high level every predetermined period from the first stage SR(1) to the eighth stage SR(8). When reaching a time point tf, a pulse of the first gate end pulse signal GEP1 is provided to this shift register 410. The first gate end pulse signal GEP1 is provided to the sixth stage SR(6) as the reset signal RESET, as shown in FIG. 1. Accordingly, the potential of the netA of the sixth stage SR(6) changes from the high level to the low level.

When reaching a time point tg, a pulse of the second gate end pulse signal GEP2 is provided to this shift register 410. The second gate end pulse signal GEP2 is provided to the seventh stage SR(7) as the reset signal RESET, as shown in FIG. 1. Accordingly, the potential of the netA of the seventh stage SR(7) changes from the high level to the low level.

When reaching a time point th, a pulse of the third gate end pulse signal GEP3 is provided to this shift register 410. The third gate end pulse signal GEP3 is provided to the eighth stage SR(8) as the reset signal RESET, as shown in FIG. 1. Accordingly, the potential of the netA of the eighth stage SR(8) changes from the high level to the low level.

1.5 Effect

According to the present embodiment, each stage SR(k) of the shift register 410 is provided with the thin-film transistor TS, of which a gate terminal is connected to the netA, a drain terminal is connected to the input terminal 43 to which the first clock CKA is provided, and a source terminal is connected to the output terminal 51 that outputs the scanning signal GOUT(k), as an output control switching element for controlling a potential of the scanning signal GOUT(k), as shown in FIG. 5. The potential of the netA is set to the high level based on the pulse of the set signal SET, and is set to the low level based on the pulse of the reset signal RESET. In this configuration, the scanning signal GOUT(k−1) outputted from the pre-stage SR(k−1) is provided to each stage SR(k) of the shift register 410, as the set signal SET. Further, the four-phase clock signals (first to fourth gate clock signals GCK1 to GCK4) of which phases are shifted by 90 degrees from each other are provided to the shift register 410. Each stage SR(k) operates based on a clock signal of which a phase is late by 90 degrees from that of the clock signal that is provided to the pre-stage SR(k−1). In this case, if it is configured such that the scanning signal GOUT(k+2) outputted from the second stage SR(k+2) after the stage concerned is provided to each stage SR(k) of the shift register 410 as the reset signal RESET, when the clock fall-rise period is set short, the potential of the netA decreases to the low level before the potential of the scanning signal GOUT(k) sufficiently decreases. Therefore, the effect of decrease of the potential of the scanning signal GOUT(k) based on the first clock CKA changing from a high level to a low level is not sufficiently obtained, and the potential of the scanning signal GOUT(k) does not quickly decrease to the low level. In this respect, according to the present embodiment, the scanning signal GOUT(k+3) outputted from the third stage SR(k+3) after the stage concerned is provided to each stage SR(k) of the shift register 410 as the reset signal RESET. Therefore, the period during which the potential of the netA is maintained at the high level becomes long, and even when the clock fall-rise period is shortened, the effect of decrease of the potential of the scanning signal GOUT(k) based on the first clock CKA changing from a high level to a low level is sufficiently obtained. That is, after ending the selected period, the potential of the scanning signal GOUT(k) quickly decreases to the low level. Accordingly, an abnormal operation due to unnecessary writing to a pixel capacitance does not occur. Further, unlike the shift register disclosed in Japanese Unexamined Patent Application Publication No. 2005-50502, a thin-film transistor for shortening a time required for the scanning signal GOUT(k) to fall may not be provided. Consequently, a clock fall-rise period can be shortened while suppressing an increase in a circuit area, an increase in current consumption, and a cost increase, without generating an abnormal operation, in a shift register within a monolithic gate driver. As a result, a charge time to a pixel capacitance can be set long, and occurrence of a display failure attributable to a shortage of charge can be suppressed.

Further, according to the present embodiment, a clock fall-rise period can be set to zero, that is, a timing when the first clock CKA changes and a timing when the second clock CKB changes can be set the same. Therefore, noise of a scanning signal can be decreased. When the clock fall-rise period is set to zero, a charge time to the pixel capacitance becomes sufficiently long, and occurrence of a display failure attributable to a shortage of charge can be effectively suppressed.

1.6 Modifications

In the first embodiment, although the capacitor C1 is provided between the netA and the output terminal 51, the present invention is not limited to this. This capacitor C1 is provided to stabilize a waveform of the scanning signal GOUT, and the configuration may be such that the capacitor C1 is not provided. Further, in the first embodiment, although the thin-film transistor T8 that is on/off controlled by the second clock CKB is provided, the present invention is not limited to this. The thin-film transistor T8 is also provided to stabilize a waveform of the scanning signal GOUT, and the configuration may be such that the thin-film transistor T8 is not provided.

Further, it can be configured such that a thin-film transistor (ninth switching element) is further provided in which the scanning signal GOUT(k+2) or GOUT(k+3) that is outputted from the second stage SR(k+2) or the third stage SR(k+3) after a stage concerned is provided to a gate terminal, a drain terminal is connected to the output terminal 51, and a source terminal is connected to the power source voltage VSS. With this, the potential of the scanning signal GOUT(k) can be more securely decreased to the low level.

2. Second Embodiment

2.1 A Configuration of a Shift Register

Figure 8:
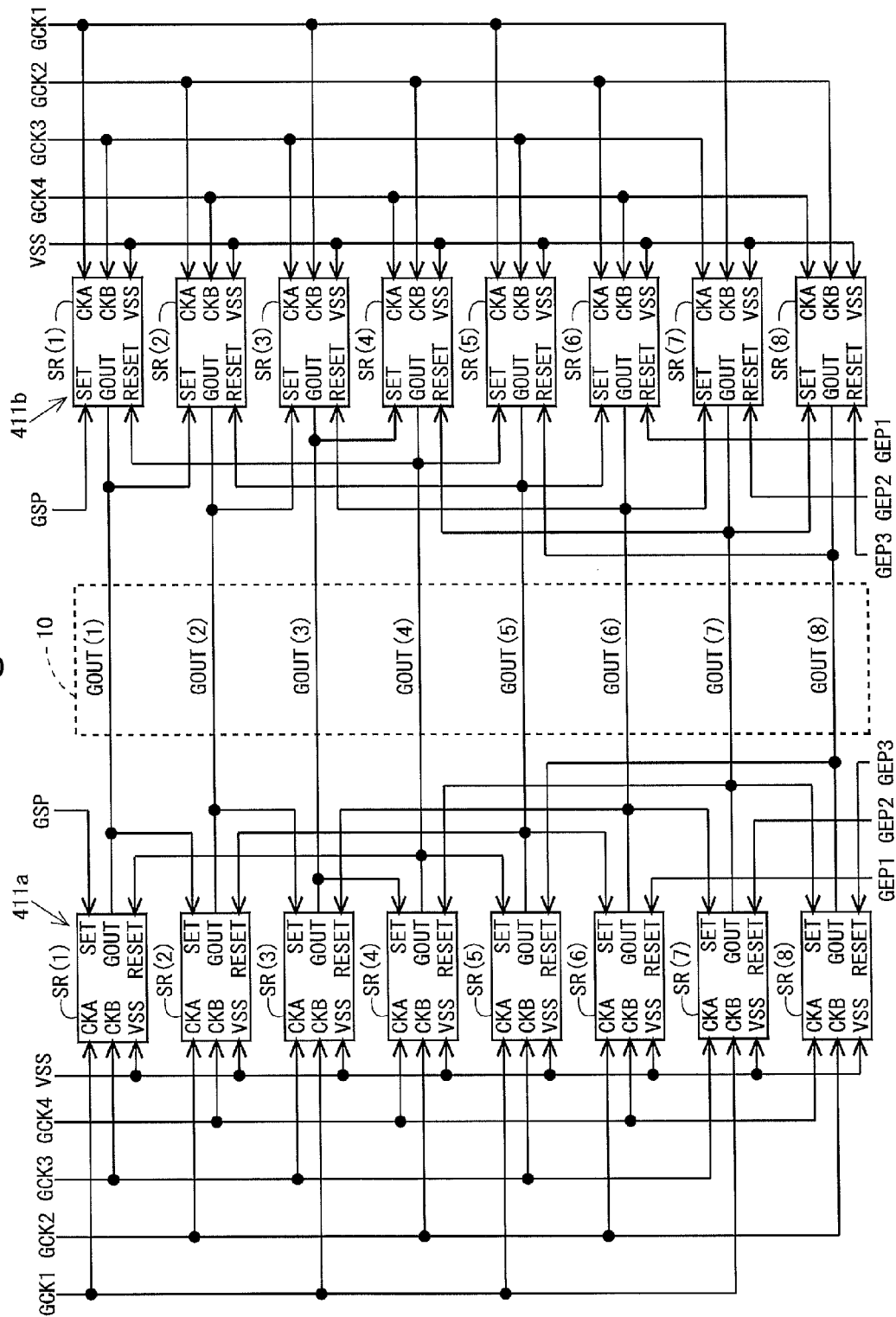
FIG. 8 is a block diagram showing a configuration of a shift register within a gate driver in a second embodiment of the present invention.

FIG. 8 is a block diagram showing a configuration of a shift register within the gate driver 40 in a second embodiment of the present invention. As shown in FIG. 8, this shift register is configured by a first shift register 411a within a gate driver provided at one side of the display unit 10, and a second shift register 411b within the gate driver provided at the other side of the display unit 10. Both the first shift register 411a and the second shift register 411b have a configuration similar to that of the shift register 410 (see FIG. 1) according to the first embodiment. Further, a configuration of each bistable circuit within the first shift register 411a and the second shift register 411b are similar to the configuration (see FIG. 5) in the first embodiment. Furthermore, an operation of each stage (bistable circuit) of the shift register and an overall operation of the shift register are also similar to those in the first embodiment, and therefore, their description is omitted.

2.2 Effects

Figure 9A:
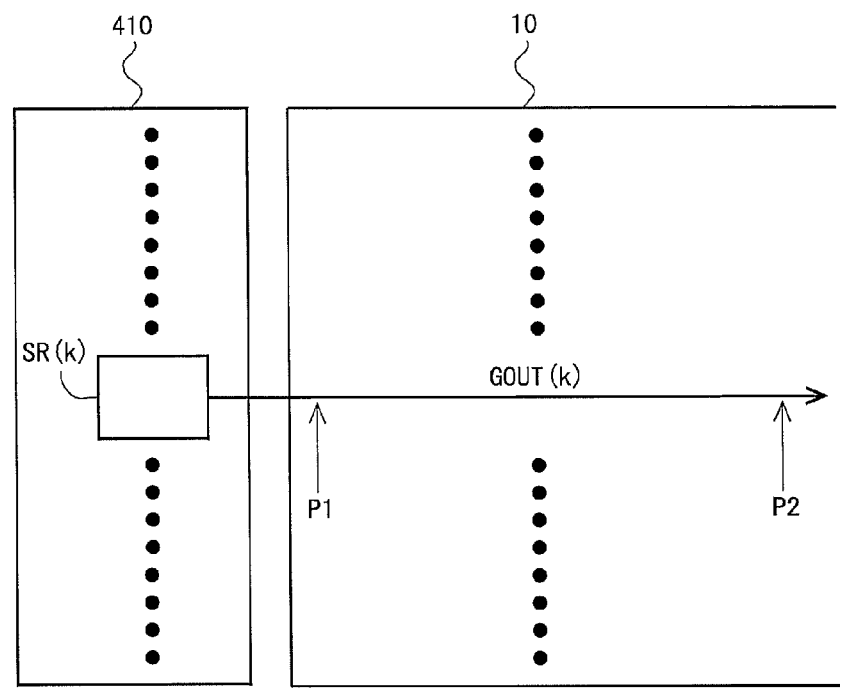
FIGS. 9A to 9C are diagrams for describing an effect of the second embodiment.
Figure 9B:
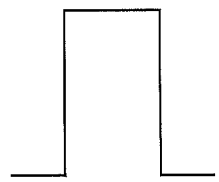
Figure 9C:
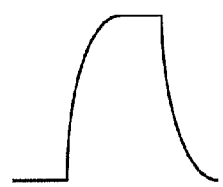

In general, a scanning signal outputted from a shift register generates a delay attributable to presence of a wiring capacitance (load) of a gate bus line. Particularly, in a display device that employs a large-type panel, when a gate driver is provided at only one side of the panel, a waveform of a scanning signal at a position near the shift register and a waveform of a scanning signal at a position far from the shift register are sometimes greatly different. For example, it sometimes occurs that a waveform of a scanning signal at a position indicated by an arrow marked by P1 in FIG. 9A becomes as shown in FIG. 9B, and that a waveform of a scanning signal at a position indicated by an arrow marked by P2 in FIG. 9A becomes as shown in FIG. 9C. In this case, a shortage of charge to a pixel capacitance occurs at a position far from the shift register, and the display quality lowers. Regarding this point, according to the present embodiment, charge is performed to one gate bus line from both sides of the display unit 10, and lowering of the display quality attributable to a shortage of charge in the large-type panel is suppressed.

3. Third Embodiment

3.1 A Configuration of a Shift Register

Figure 10:
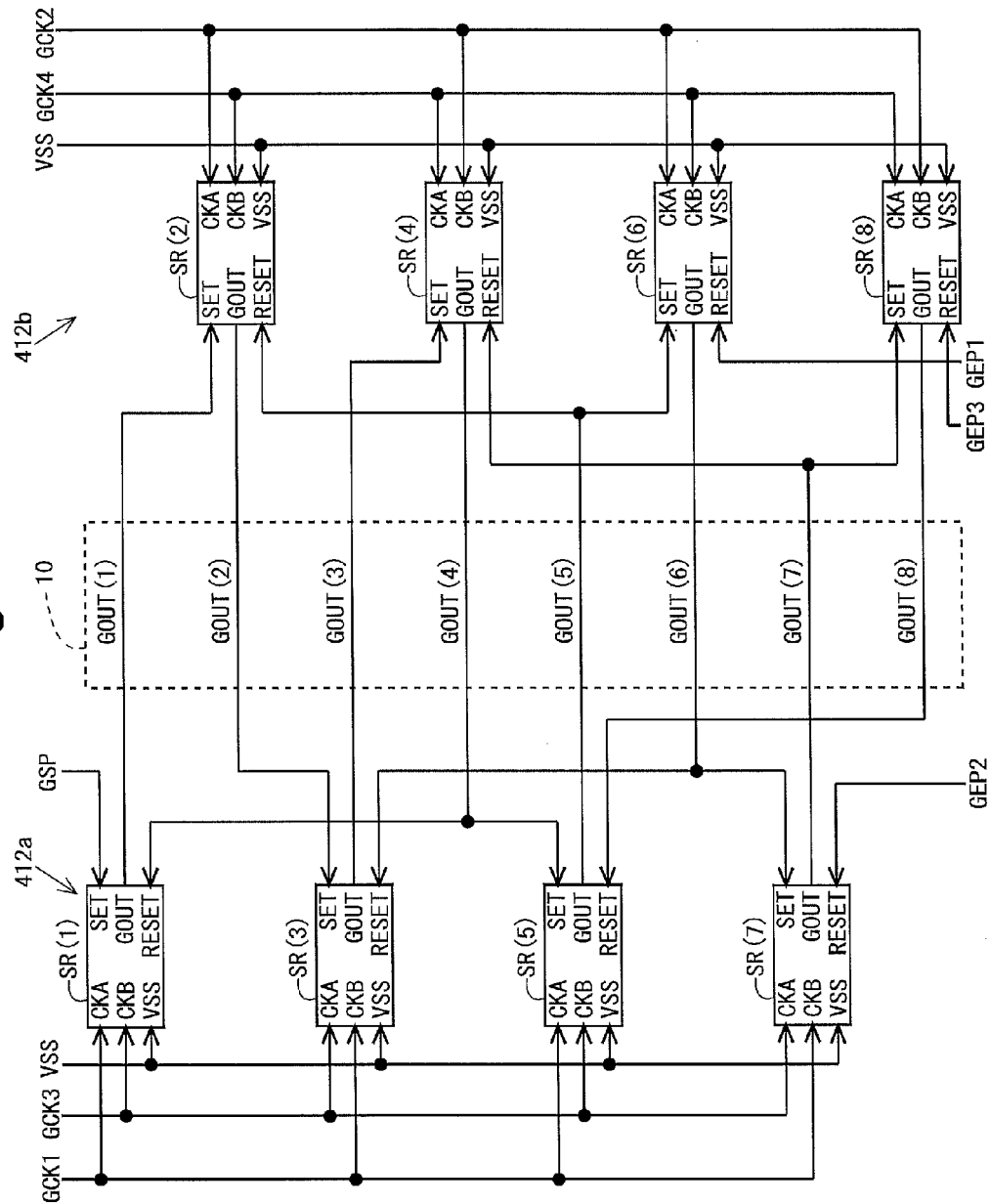
FIG. 10 is a block diagram showing a configuration of a shift register within a gate driver in a third embodiment of the present invention.

FIG. 10 is a block diagram showing a configuration of a shift register within the gate driver 40 in a third embodiment of the present invention. As shown in FIG. 10, this shift register is configured by a first shift register 412a within a gate driver provided at one side of the display unit 10, and a second shift register 412b within the gate driver provided at the other side of the display unit 10. More specifically, out of a bistable circuit within the shift register 410 (see FIG. 1) in the first embodiment, the odd-order stages SR(1), SR(3), SR(5), SR(7) are provided at one side of the display unit 10 (a left side of the display unit 10 in FIG. 10), and the even-order stages SR(2), SR(4), SR(6), SR(8) are provided at the other side of the display unit 10 (a right side of the display unit 10 in FIG. 10). Note that, a configuration and an operation of each bistable circuit and an overall operation of the shift register are similar to those in the first embodiment, and therefore, their description is omitted.

3.2 Effects

According to the present embodiment, a size per one stage of a shift register (a size in a direction to which a source bus line extends) can be set to approximately a half of the size in the first embodiment. Therefore, an area that is necessary as a picture-frame of a panel can be reduced, and reduction in sizes of various products that use a liquid crystal panel can be realized.

4. Fourth Embodiment

4.1 An Overall Configuration and a Configuration of a Gate Driver

In the present embodiment, an overall configuration and a schematic configuration of a gate driver are substantially similar to the configurations in the first embodiment shown in FIGS. 2 and 3, and therefore, their detailed description is omitted.

4.2 A Configuration of a Bistable Circuit

Figure 11:
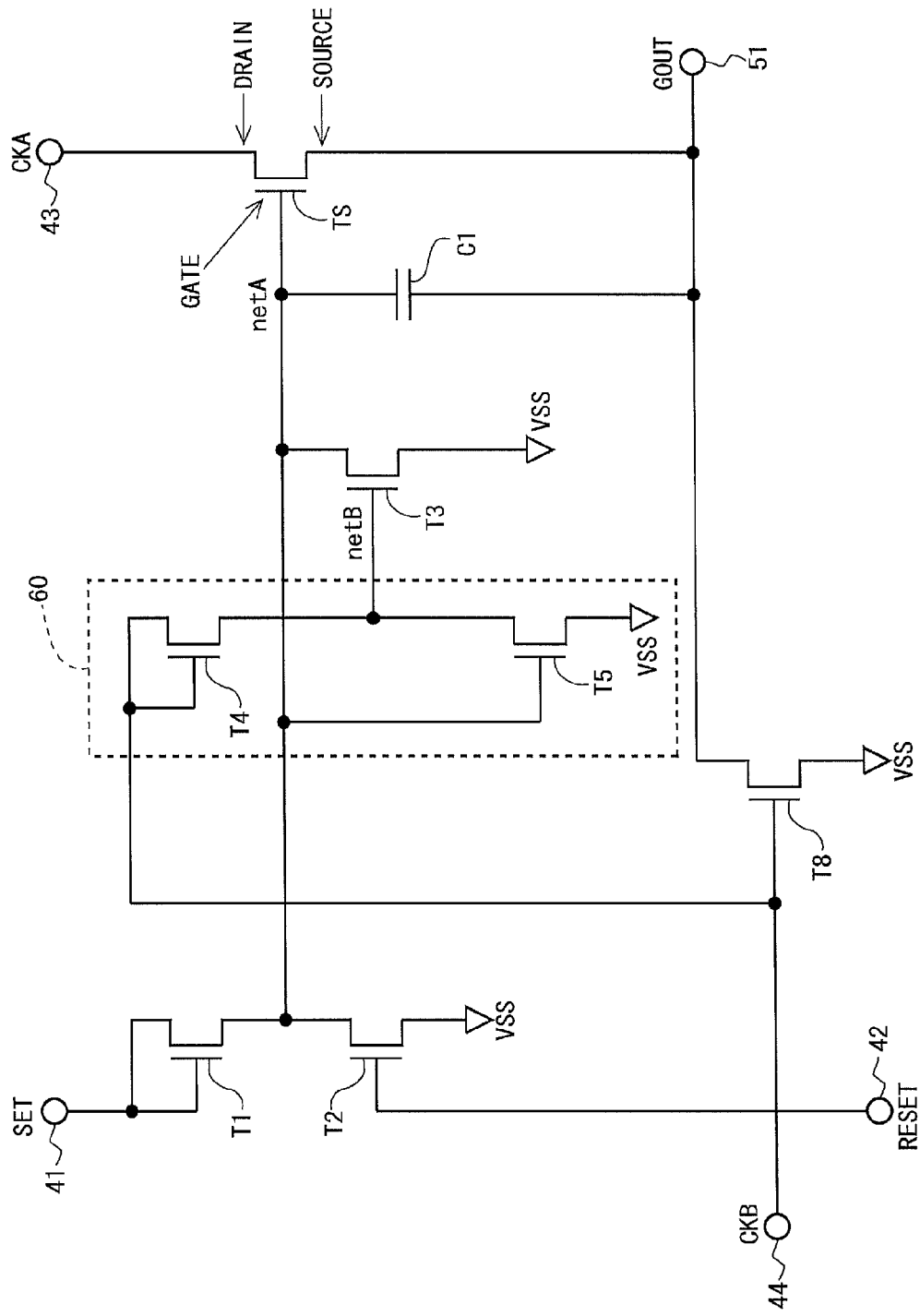
FIG. 11 is a circuit diagram showing a configuration of a bistable circuit included in a shift register in a fourth embodiment of the present invention.

FIG. 11 is a circuit diagram showing a configuration of a bistable circuit according to the present embodiment. In the present embodiment, in addition to the constituent elements in the first embodiment shown in FIG. 5, there are provided three thin-film transistors T3 (third switching element), T4 (fourth switching element), and T5 (fifth switching element). A gate terminal of the thin-film transistor T3, a source terminal of the thin-film transistor T4, and a drain terminal of the thin-film transistor T5 are connected to each other. Note that, a region (wiring) in which these terminals are connected to each other is called a "netB" (second node) for convenience.

Figure 12:
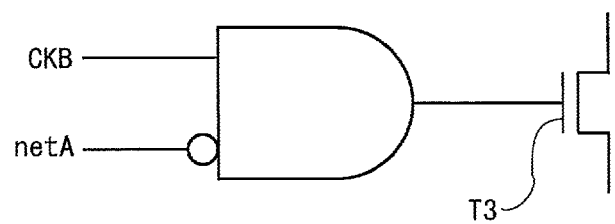
FIG. 12 is a diagram for describing a circuit of a portion indicated by a reference numeral 60 in FIG. 11.

In the thin-film transistor T3, the gate terminal is connected to the netB, a drain terminal is connected to the netA, and a source terminal is connected to the power source voltage VSS. In the thin-film transistor T4, a gate terminal and a drain terminal are connected to the input terminal 44 (that is, in a diode connection), and the source terminal is connected to the netB. In the thin-film transistor T5, a gate terminal is connected to the netA, the drain terminal is connected to the netB, and a source terminal is connected to the power source voltage VSS. The thin-film transistor T3 sets the potential of the netA to the low level when the potential of the netB is at the high level. The thin-film transistor T4 sets the potential of the netB to the high level when the second clock CKB is at the high level. The thin-film transistor T5 sets the potential of the netB to the low level when the potential of the netA is at the high level. With the above configuration, a circuit of a portion indicated by a reference numeral 60 in FIG. 11 is an AND circuit (logic circuit shown in FIG. 12) that outputs AND of a logical value of a logical inversion signal of a signal that indicates the potential of the netA and a logical value of the second clock CKB. Accordingly, when the potential of the netA is at the low level and the second clock CKB is at the high level, the thin-film transistor T3 becomes in an on state, and the potential of the netA is pulled to the potential of the power source voltage VSS. Note that, in the present embodiment, a second node control unit is realized by this AND circuit.

4.3 An operation of a Shift Register

Figure 13:
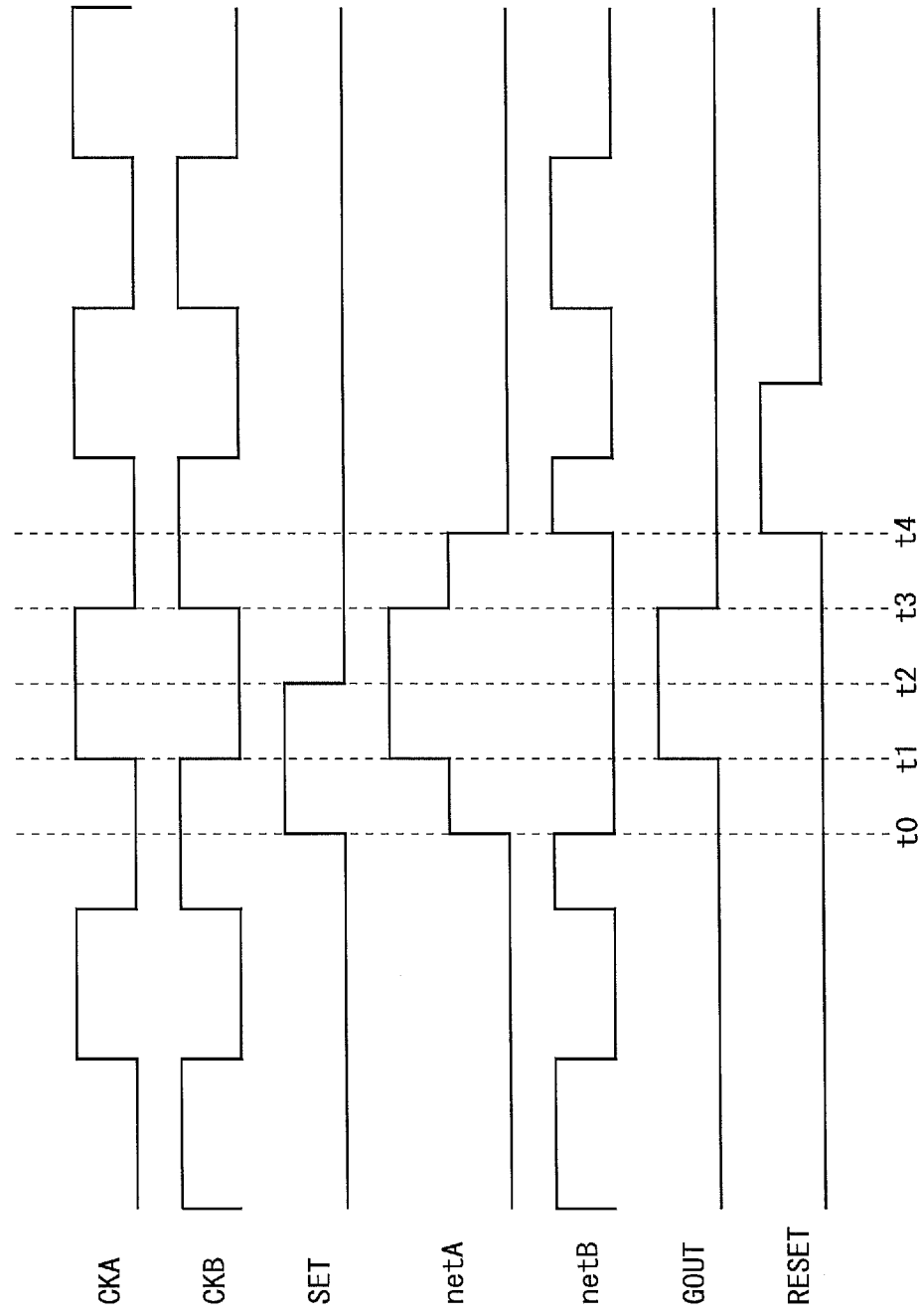
FIG. 13 is a timing chart for describing an operation of each stage of the shift register in the fourth embodiment.

An operation of each stage (bistable circuit) of the shift register 410 according to the present embodiment is described next with reference to FIGS. 11 and 13. As shown in FIG. 13, during an operation of the liquid crystal display device, the first clock CKA is provided to the input terminal 43, and the second clock CKB is provided to the input terminal 44. Here, an overall operation of the shift register 410 is similar to that of the first embodiment, and therefore, its description is omitted.

During a period before a time point t0, an operation similar to that of the first embodiment is performed, except that the potential of the netB becomes at a high level and the thin-film transistor T3 becomes in an on state every predetermined period in accordance with a change of the potential of the second clock CKB. Specifically, during the period before the time point t0, while the potential of the netA is maintained at the low level, the potential of the second clock CKB is alternately repeated at the high level and the low level every predetermined period. As described above, the thin-film transistor T3 becomes in an on state, when the potential of the netA is at the low level and the second clock CKB is at the high level. Therefore, during the period before the time point t0, the thin-film transistor T3 becomes in an on state during the period when the second clock CKB is at the high level.

When reaching the time point t0, the pulse of the set signal SET is provided to the input terminal 41. Accordingly, the potential of the netA changes from the low level to the high level, and the thin-film transistor TS becomes in an on state, in a similar manner to that in the first embodiment. During the period from the time point t0 to a time point t1, the scanning signal GOUT is maintained at the low level, in a similar manner to that in the first embodiment. Incidentally, in the present embodiment, the gate terminal of the thin-film transistor T5 is connected to the netA. Therefore, by the potential of the netA becoming at the high level, the thin-film transistor T5 becomes in an on state. Because the potential of the netB becomes at the low level accordingly, the thin-film transistor T3 becomes in an off state. Consequently, during the period from the time point t0 to the time point t1, it does not occur that "the thin-film transistor T3 becomes in an on state and the potential of the netA decreases".

When reaching the time point t1, the first clock CKA changes from the low level to the high level. Accordingly, the potential of the netA increases, in a similar manner to that in the first embodiment. The potential of the scanning signal GOUT increases to a high-level potential of the first clock CKA, and a gate bus line connected to the output terminal 51 of the bistable circuit becomes in a selected state. Incidentally, because the potential of the netA is at the high level from the time point t0, the thin-film transistor T5 is maintained in the on state. Further, during the period from the time point t1 to a time point t2, because the second clock CKB is at the low level, the thin-film transistor T4 is in an off state. Therefore, during the period from the time point t1 to the time point t2, the potential of the netB becomes at a low level, and the thin-film transistor T3 becomes in an off state. Consequently, during the period from the time point t1 to the time point t2, it does not occur that "the thin-film transistor T3 becomes in an on state and the potential of the netA decreases".

When reaching the time point t2, the set signal SET changes from the high level to a low level, and the thin-film transistor T1 becomes in an off state. At this time, the potential of the netA does not vary, in a similar manner to that in the first embodiment. When reaching a time point t3, the first clock CKA changes from the high level to the low level, and a potential of the netA decreases, in a similar manner to that in the first embodiment The potential of the netA becomes lower than that during the period from the time point t1 to the time point t3, but is maintained in the high-level state. At the time point t3, the second clock CKB changes from the low level to the high level, and a potential of the scanning signal GOUT quickly becomes at the low level, in a similar manner to that in the first embodiment. Because the potential of the netA is maintained at the high level as described above, the thin-film transistor T5 is maintained in the on state also during a period after the time point t3. Because the potential of the netB becomes at the low level accordingly, the thin-film transistor T3 becomes in an off state. Therefore, during the period from the time point t3 to a time point t4, it does not occur that "the thin-film transistor T3 becomes in an on state and the potential of the netA decreases". During a period after the time point t4, an operation similar to that in the first embodiment is performed, except that a potential of the netB becomes at a high level every predetermined period and the thin-film transistor T3 becomes in an on state in accordance with a change of the potential of the second clock CKB.

4.4 Effect

According to the present embodiment, during a period before the time point t0 and during a period after the time point t4, the potential of the netB becomes at the high level every predetermined period in accordance with a change of the potential of the second clock CKB (see FIG. 13). Therefore, during the period before the time point t0 and during the period after the time point t4, the thin-film transistor T3 becomes in an on state every predetermined period. Consequently, even when a shift of a threshold voltage of the thin-film transistor TS occurs due to high-temperature aging and a leakage current in the thin-film transistor TS becomes large, for example, the potential of the netA is securely set to the low level every predetermined period, and output of an abnormal pulse from the output terminal 51 is suppressed. Further, occurrence of an abnormal operation of a shift register due to sequential application of such an abnormal pulse to a latter stage is suppressed.

5. Fifth Embodiment

5.1 A Configuration of a Shift Register

Figure 14:
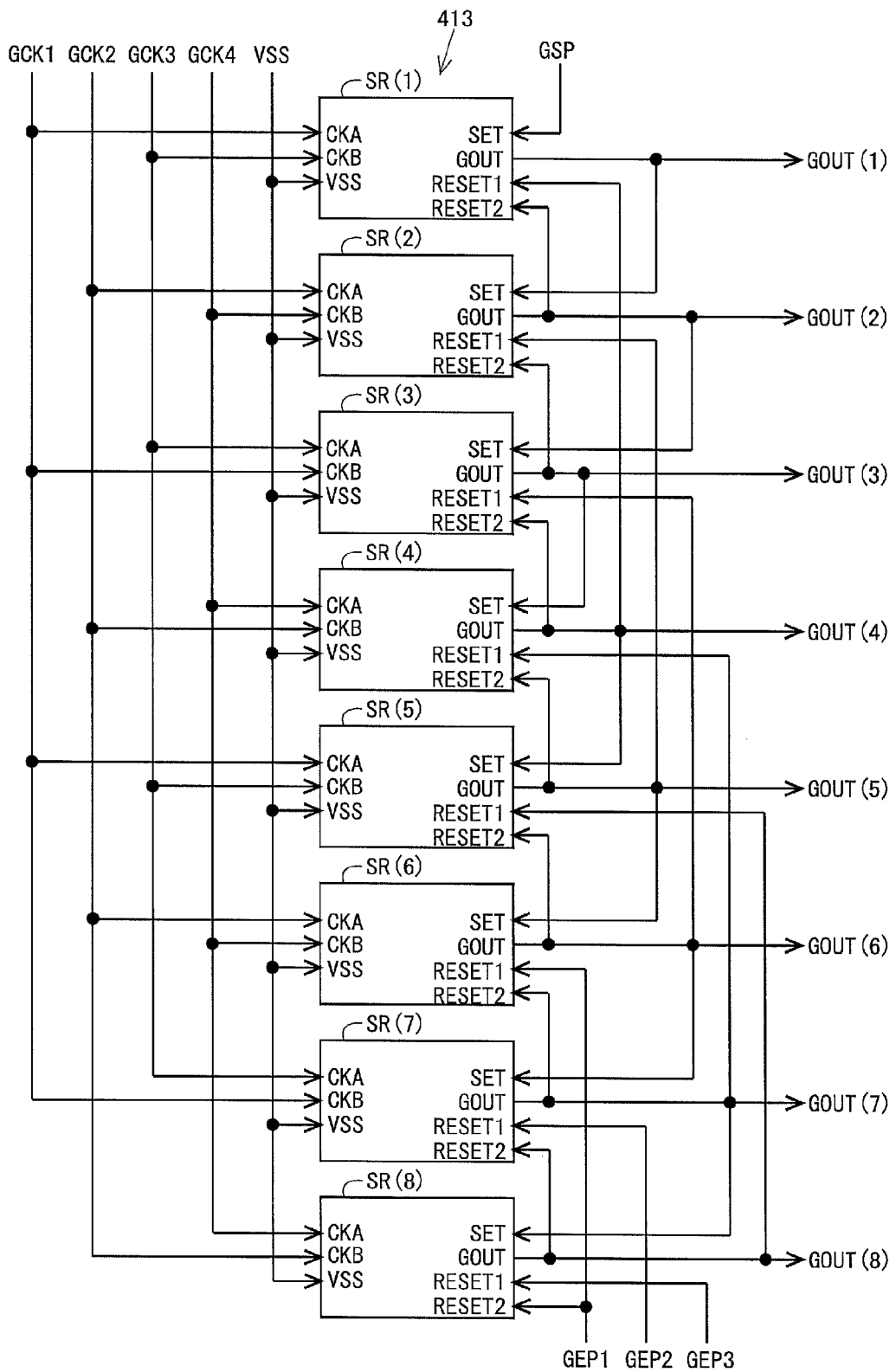
FIG. 14 is a block diagram showing a configuration of a shift register within a gate driver in a fifth embodiment of the present invention.

FIG. 14 is a block diagram showing a configuration of a shift register 413 within the gate driver 40 according to this embodiment. As shown in FIG. 14, the shift register 413 is configured by eight bistable circuits SR(1) to SR(8). Each bistable circuit is provided with an input terminal for receiving a second reset signal RESET2, in addition to the input/output terminal in the first embodiment shown in FIG. 1. Note that, in the present embodiment, a signal that corresponds to the reset signal RESET in the first embodiment is called a first reset signal RESET1. An overall configuration and a schematic configuration of a gate driver are substantially similar to configurations in the first embodiment shown in FIGS. 2 and 3, and therefore, their detailed description is omitted.

Figure 15:
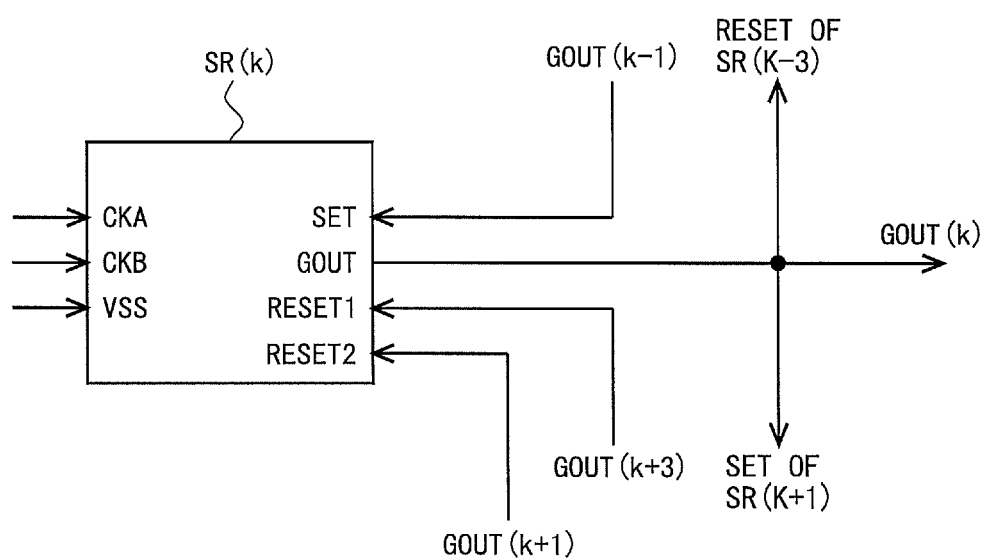
FIG. 15 is a diagram for describing input/output signals of a k-th stage bistable circuit of a shift register in the fifth embodiment.

As shown in FIGS. 14 and 15, when the k-th stage SR(k) is focused, the next-stage scanning signal GOUT(k+1) is provided as the second reset signal RESET2. However, the first gate end pulse signal GEP1 is provided to the eighth-stage (last stage) SR(8) as the second reset signal RESET2. Other signals than the second reset signal RESET2 are similar to those in the first embodiment.

5.2 A Configuration of a Bistable Circuit

Figure 16:
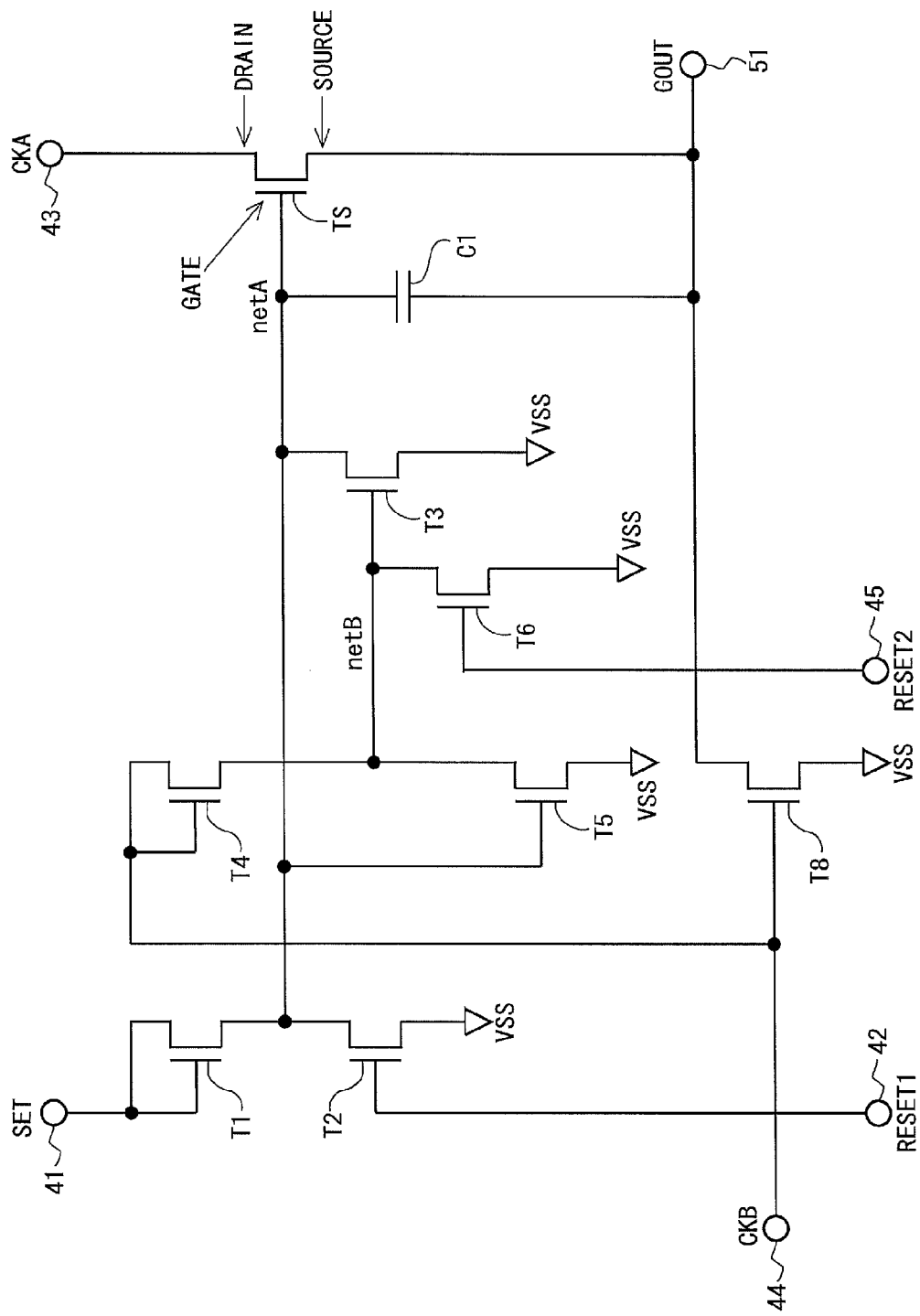
FIG. 16 is a circuit diagram showing a configuration of a bistable circuit included in the shift register in the fifth embodiment.

FIG. 16 is a circuit diagram showing a configuration of a bistable circuit according to the present embodiment. In the present embodiment, in addition to constituent elements in the fourth embodiment shown in FIG. 11, there are provided a thin-film transistor T6 (sixth switching element), and an input terminal 45 that receives the second reset signal RESET2. In the thin-film transistor T6, a gate terminal is connected to the input terminal 45, a drain terminal is connected to the netB, and a source terminal is connected to the power source voltage VSS.

5.3 An Operation of a Shift Register

Figure 17:
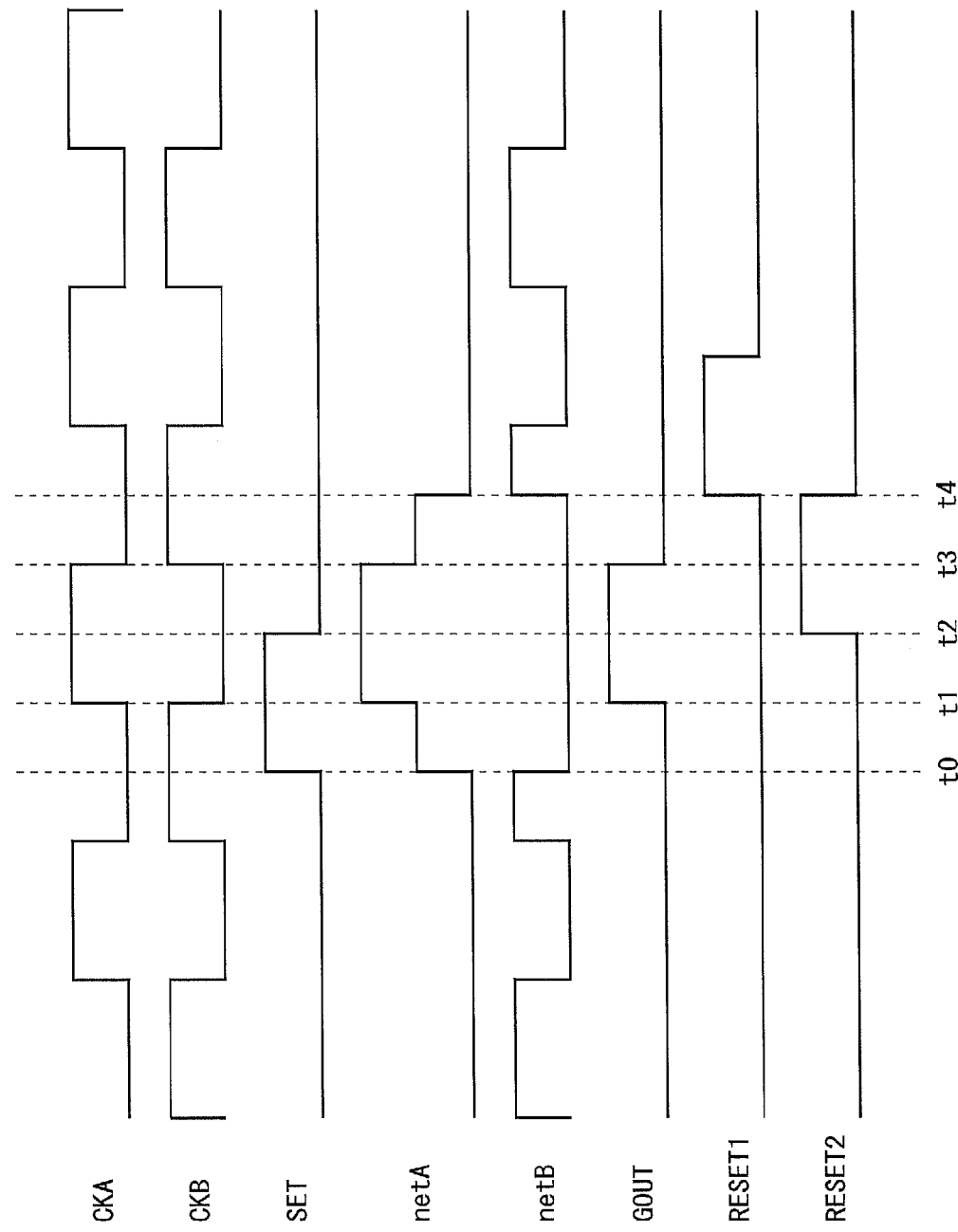
FIG. 17 is a timing chart for describing an operation of each stage of the shift register in the fifth embodiment.

An operation of each stage (bistable circuit) of the shift register 413 according to the present embodiment is described next with reference to FIGS. 16 and 17. Here, an overall operation of the shift register 413 is similar to that in the first embodiment, and therefore, its description is omitted. During a period before a time point t2, an operation similar to that in the fourth embodiment is performed. When reaching the time point t2, the second reset signal RESET2 changes from a low level to a high level. Accordingly, the thin-film transistor T6 becomes in an on state. A state that the second reset signal RESET2 is set to the high level is maintained till a time point t4. As a result, during the period from the time point t2 to the time point t4, the potential of the netB is fixed to the potential of the power source voltage VSS. During a period after the time point t3, an operation similar to that in the fourth embodiment is performed, except that the second reset signal RESET2 changes from the high level to the low level at the time point t4 and that the thin-film transistor T6 becomes in an off state.

5.4 Effect

According to the configuration in the fourth embodiment shown in FIG. 11, when the second clock CKB is at the high level and the potential of the netA is at the high level, the thin-film transistors T4 and T5 become in an on state. At this time, the netB becomes in a floating state, and the potential of the netB is not determined. Therefore, there is a risk that during a period when the netA should be maintained at the high level, the thin-film transistor T3 becomes in an on state and the potential of the netA decreases. In this respect, according to the present embodiment, the potential of the netB is securely maintained at the low level, during the period from the time point t3 to the time point t4 when both the potential of the second clock CKB and the potential of the netA become at the high level. Consequently, during the period from the time point t3 to the time point t4, the potential of the netA is securely maintained at the high level, and the thin-film transistor T5 is securely maintained in an on state. As a result, the potential of the scanning signal GOUT securely decreases to the low level in accordance with the change of the first clock CKA from the high level to the low level at the time point t3.

6. Sixth Embodiment

6.1 A Configuration of a Shift Register

Figure 18:
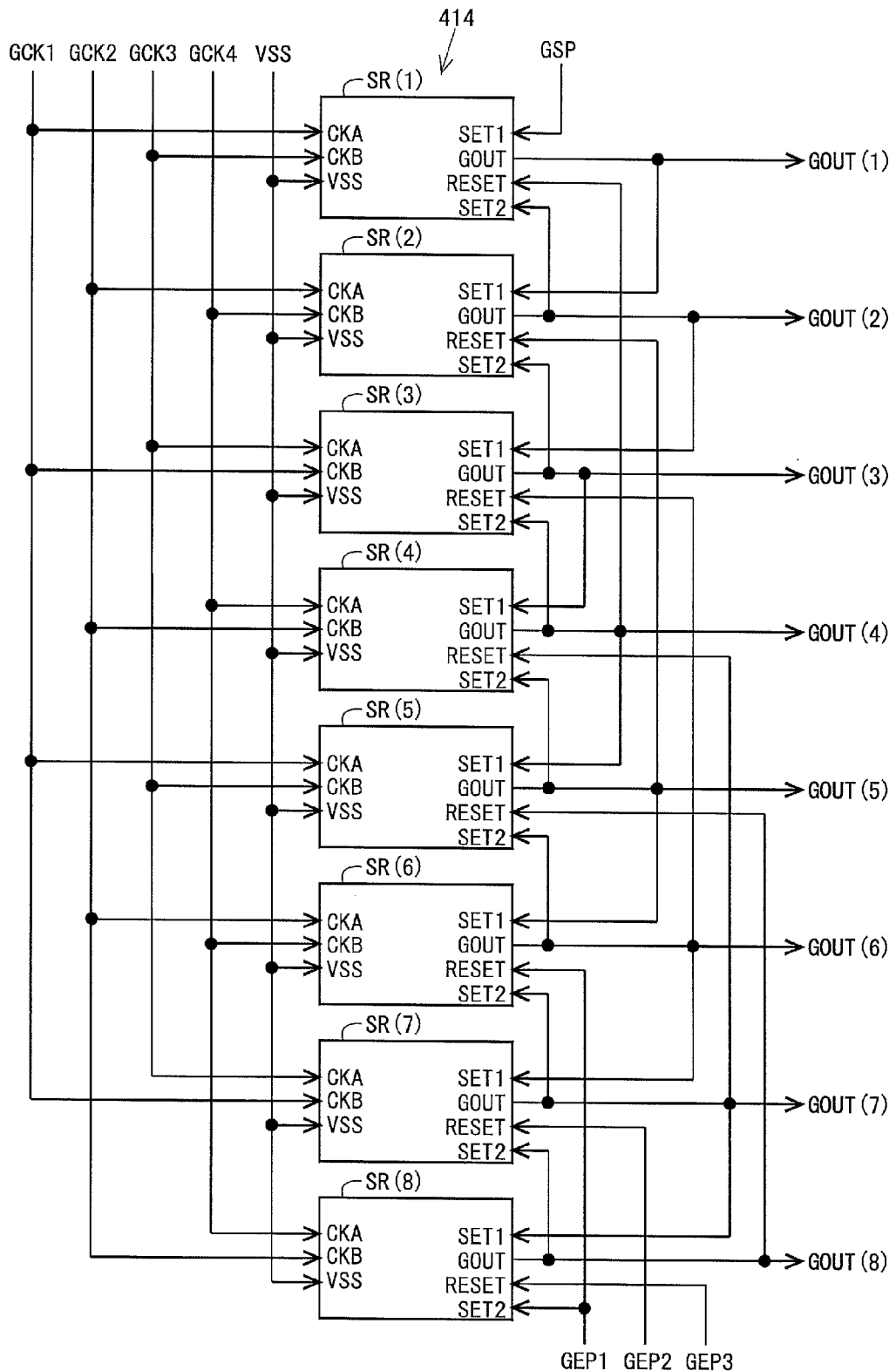
FIG. 18 is a block diagram showing a configuration of a shift register within a gate driver in a sixth embodiment of the present invention.

FIG. 18 is a block diagram showing a configuration of a shift register 414 within the gate driver 40 according to a sixth embodiment. As shown in FIG. 18, the shift register 414 is configured by eight bistable circuits SR(1) to SR(8). Each bistable circuit is provided with an input terminal for receiving the second set signal SET2, in addition to the input/output terminal in the first embodiment shown in FIG. 1. Note that, in the present embodiment, a signal that corresponds to the set signal SET in the first embodiment is called a first set signal SET1. An overall configuration and a schematic configuration of a gate driver are substantially similar to configurations in the first embodiment shown in FIGS. 2 and 3, and therefore, their detailed description is omitted.

Figure 19:
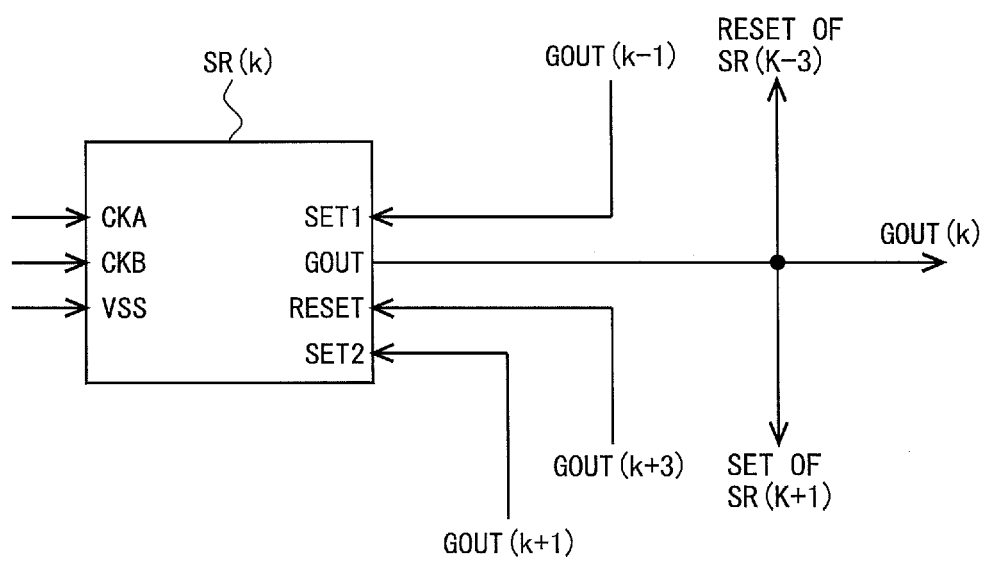
FIG. 19 is a diagram for describing input/output signals of a k-th stage bistable circuit of a shift register in the sixth embodiment.

As shown in FIGS. 18 and 19, when the k-th stage SR(k) is focused, the next-stage scanning signal GOUT(k+1) is provided as the second set signal SET2. However, the first gate end pulse signal GEP1 is provided to the eighth-stage (last stage) SR(8) as the second set signal SET2. Other signals than the second set signal SET2 are similar to those in the first embodiment.

6.2 A Configuration of a Bistable Circuit

Figure 20:
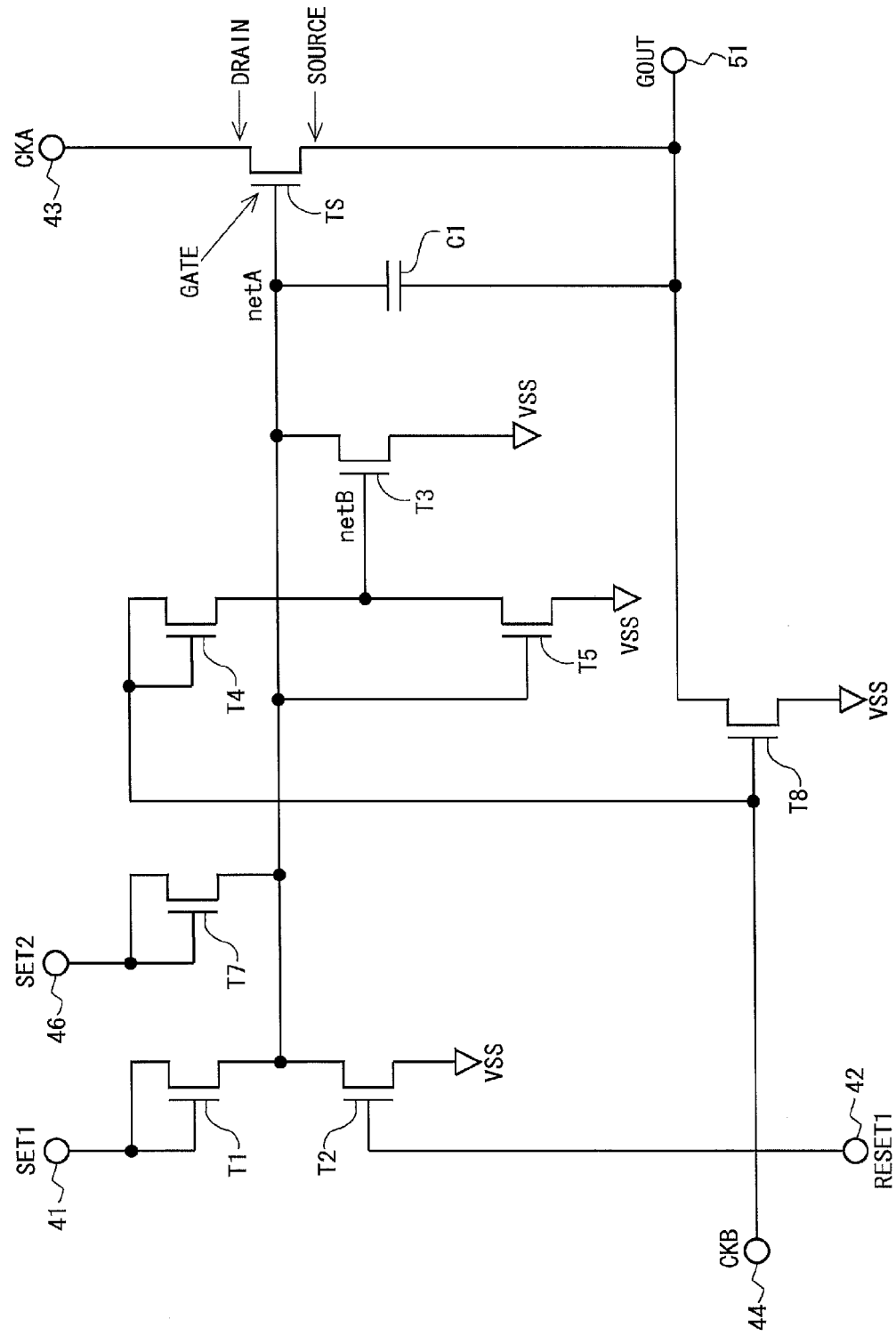
FIG. 20 is a circuit diagram showing a configuration of a bistable circuit included in the shift register in the sixth embodiment.

FIG. 20 is a circuit diagram showing a configuration of a bistable circuit according to the present embodiment. In the present embodiment, in addition to constituent elements in the fourth embodiment shown in FIG. 11, there are provided a thin-film transistor T7 (seventh switching element), and an input terminal 46 that receives the second set signal SET2. In the thin-film transistor T7, a gate terminal and a drain terminal are connected to the input terminal 46 (that is, in a diode connection), and a source terminal is connected to the netA. In the present embodiment, a second first-node charge unit is realized by the thin-film transistor T7.

6.3 An Operation of a Shift Register

Figure 21:
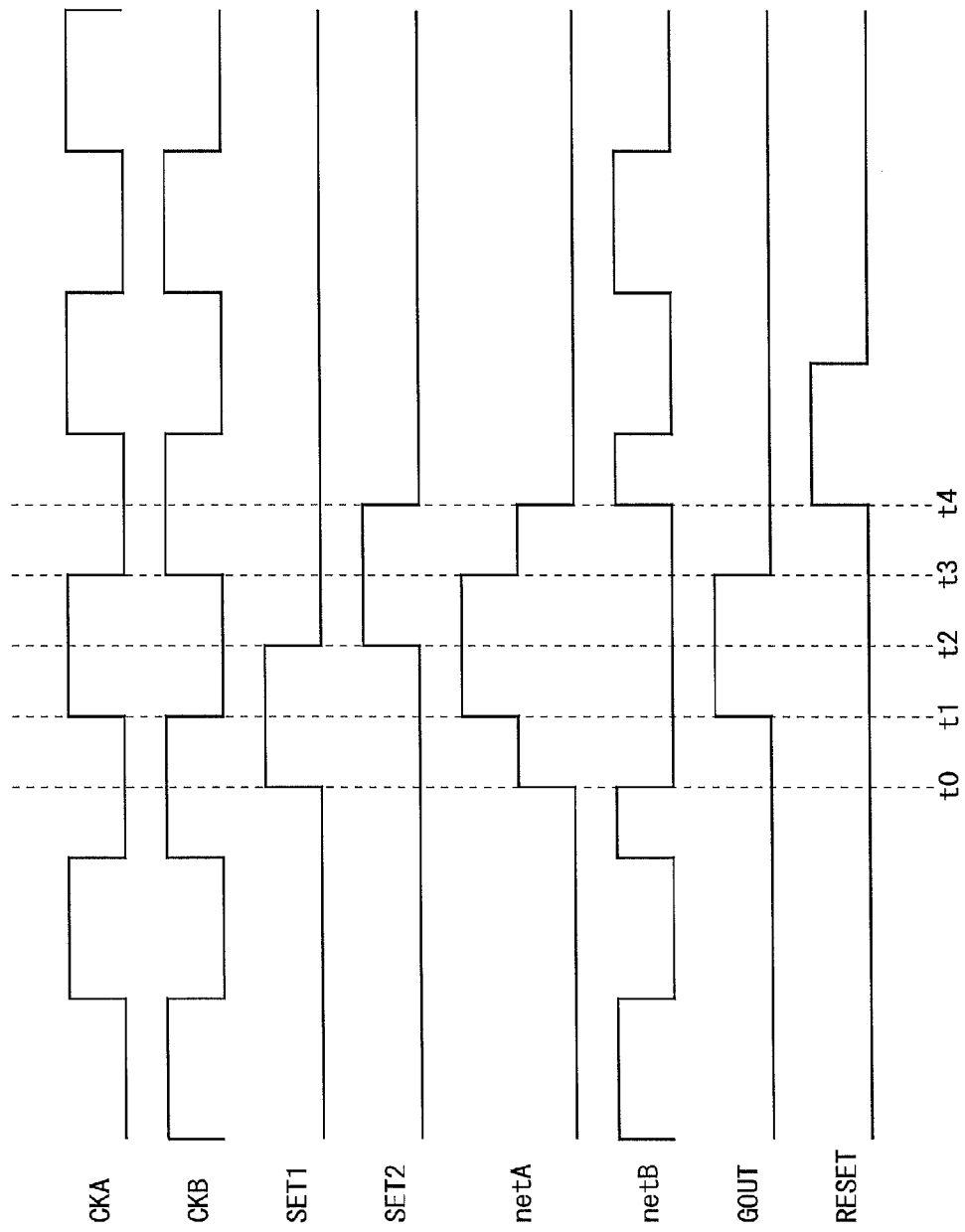
FIG. 21 is a timing chart for describing an operation of each stage of the shift register in the sixth embodiment.

An operation of each stage (bistable circuit) of the shift register 414 according to the present embodiment is described next with reference to FIGS. 20 and 21. Here, an overall operation of the shift register 414 is similar to that in the first embodiment, and therefore, its description is omitted. During a period before a time point t2, an operation similar to that in the fourth embodiment is performed. When reaching the time point t2, the second set signal SET2 changes from a low level to a high level. Accordingly, the thin-film transistor T7 becomes in an on state. A state that the second set signal SET2 is set to the high level is maintained till a time point t4. As a result, during the period from the time point t2 to the time point t4, the potential of the netA is securely maintained at the high level. During a period after the time point t3, an operation similar to that in the fourth embodiment is performed, except that the second set signal SET2 changes from the high level to the low level at the time point t4 and that the thin-film transistor T7 becomes in an off state.

6.4 Effect

As described above, according to the configuration in the fourth embodiment shown in FIG. 11, the potential of the netB is not determined when the second clock CKB is at a high level and the potential of the netA is at a high level. Therefore, there is a risk that during a period when the netA should be maintained at the high level, the thin-film transistor T3 becomes in an on state and the potential of the netA decreases. In this respect, according to the present embodiment, the potential of the netA is securely maintained at the high level, even when the netB becomes in a floating state, during the period from the time point t3 to the time point t4 when both the potential of the second clock CKB and the potential of the netA become at the high level. Consequently, the potential of the scanning signal GOUT securely decreases to the low level in accordance with the change of the first clock CKA from the high level to the low level at the time point t3.

7. Seventh Embodiment

7.1 A Configuration of a Shift Register

Figure 22:
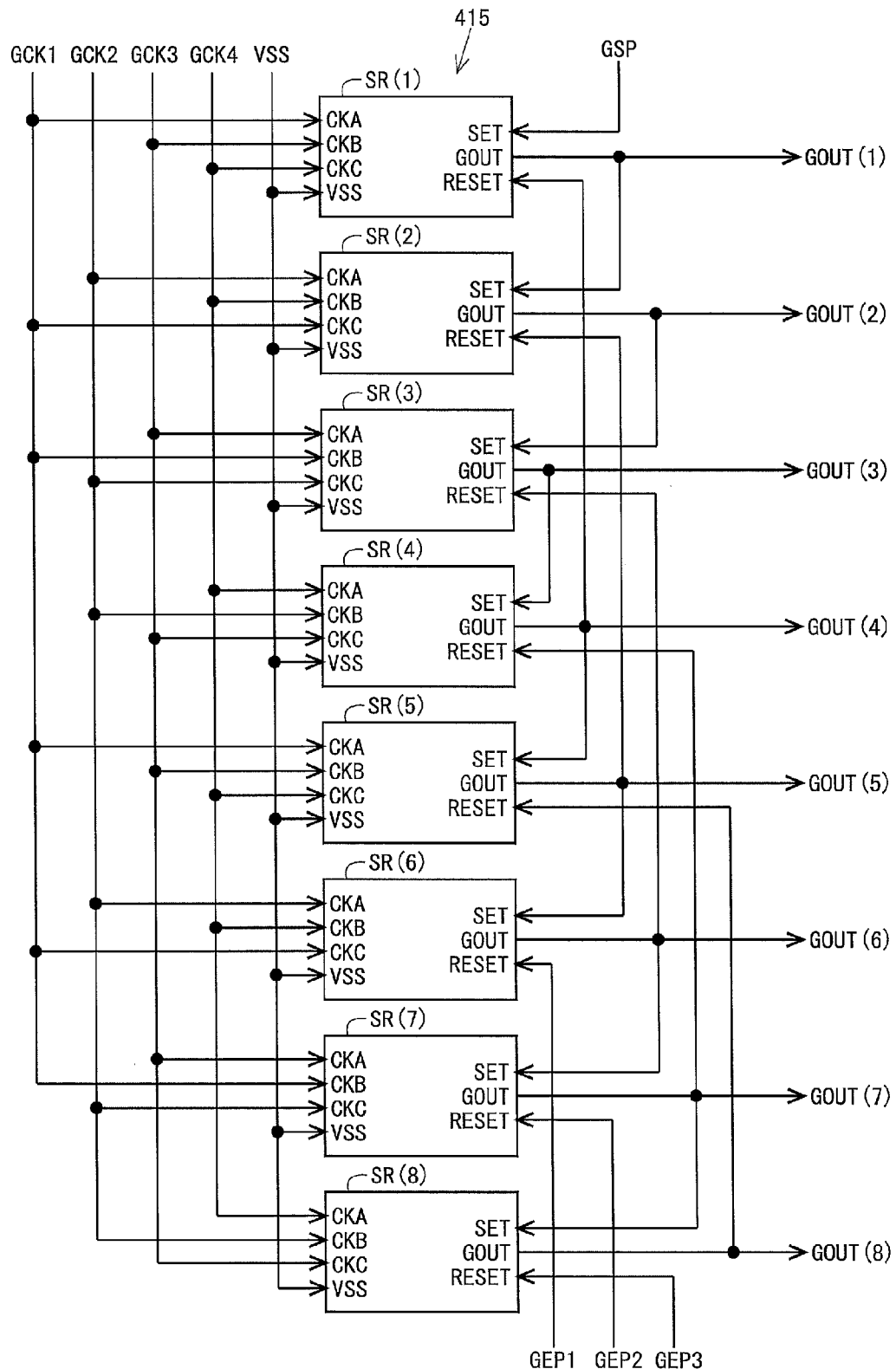
FIG. 22 is a block diagram showing a configuration of a shift register within a gate driver in a seventh embodiment of the present invention.

FIG. 22 is a block diagram showing a configuration of a shift register 415 within the gate driver 40 according to a seventh embodiment. As shown in FIG. 22, the shift register 415 is configured by eight bistable circuits SR(1) to SR(8). Each bistable circuit is provided with an input terminal for receiving a third clock CKC, in addition to the input/output terminal in the first embodiment shown in FIG. 1. An overall configuration and a schematic configuration of a gate driver are substantially similar to configurations in the first embodiment shown in FIGS. 2 and 3, and therefore, their detailed description is omitted.

Signals that are provided to each stage as the third clock CKC are described next. As the third clock CKC, a fourth gate clock signal GCK4 is provided to a first stage SR(1) and a fifth stage SR(5), a first gate clock signal GCK1 is provided to a second stage SR(2) and a sixth stage SR(6), a second gate clock signal GCK2 is provided to a third stage SR(3) and a seventh stage SR(7), and a third gate clock signal GCK3 is provided to a fourth stage SR(4) and an eighth stage SR(8). Signals other than the third clock CKC are similar to those in the first embodiment.

7.2 A Configuration of a Bistable Circuit

Figure 23:
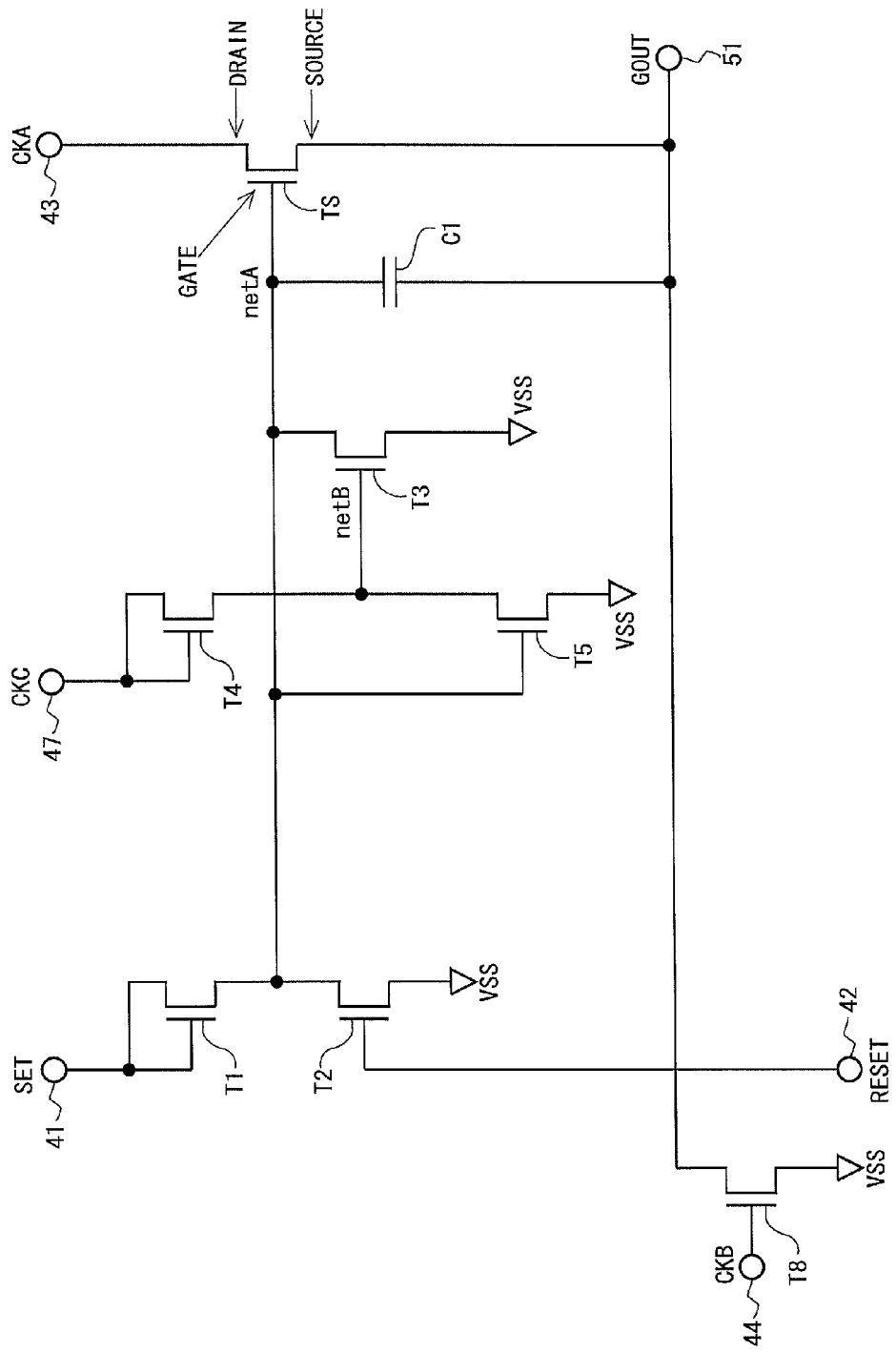
FIG. 23 is a circuit diagram showing a configuration of a bistable circuit included in the shift register in the seventh embodiment.

FIG. 23 is a circuit diagram showing a configuration of a bistable circuit according to the present embodiment. In the present embodiment, in addition to constituent elements in the fourth embodiment shown in FIG. 11, an input terminal 47 that receives the third clock CKC is provided. Although the gate terminal and the drain terminal of the thin-film transistor T4 are connected to the input terminal 44 in the fourth embodiment, these terminals are connected to the input terminal 47 in the present embodiment. Other configurations are similar to those in the fourth embodiment.

7.3 An Operation of a Shift Register

Figure 24:
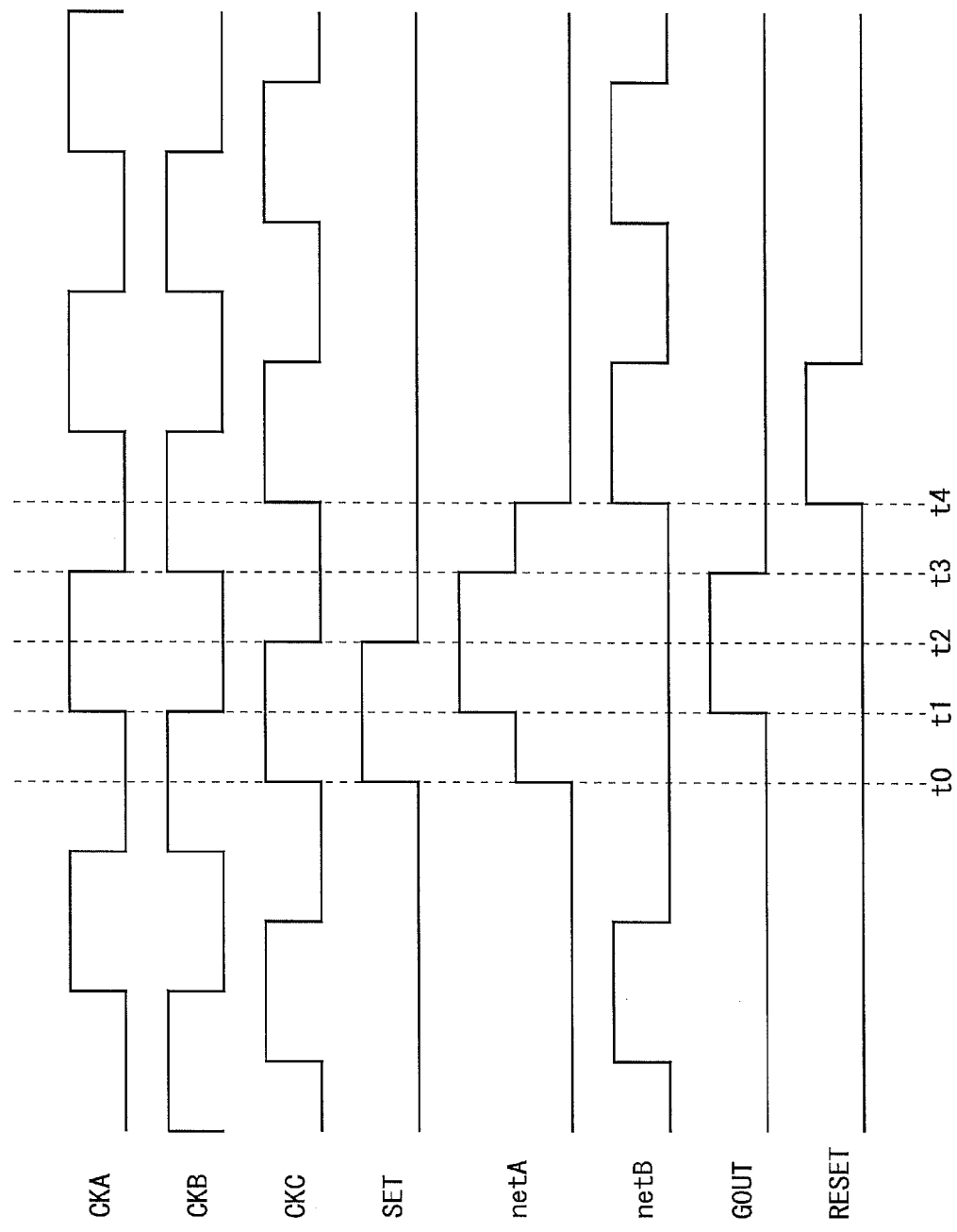
FIG. 24 is a timing chart for describing an operation of each stage of the shift register in the seventh embodiment.

An operation of each stage (bistable circuit) of the shift register 415 according to the present embodiment is described next with reference to FIGS. 23 and 24. Here, an overall operation of the shift register 415 is similar to that in the first embodiment, and therefore, its description is omitted. As shown in FIG. 24, during an operation of the liquid crystal display device, the first clock CKA is provided to the input terminal 43, the second clock CKB is provided to the input terminal 44, and the third clock CKC is provided to the input terminal 47.

During a period before a time point t0, an operation similar to that in the first embodiment is performed, except that a potential of the netB becomes at a high level every predetermined period in accordance with a change of a potential of the third clock CKC and the thin-film transistor T3 becomes in an on state. Specifically, during the period before the time point t0, while a potential of the netA is maintained at a low level, a potential of the third clock CKC is alternately repeated at a high level and a low level every predetermined period. The thin-film transistor T3 becomes in an on state, when the potential of the netA is at the low level and the third clock CKC is at the high level. Therefore, during the period before the time point t0, the thin-film transistor T3 becomes in an on state during the period when the third clock CKC is at the high level.

During a period from the time point t0 to a time point t4, an operation similar to that in the fourth embodiment is performed, except that a timing when an on/off state of the thin-film transistor T4 changes is different. Note that during the period from the time point t0 to the time point t4, because the potential of the netA is at the high level, the potential of the netB is maintained at a low level regardless of the change of the on/off state of the thin-film transistor T4. During a period after the time point t4, an operation similar to that in the first embodiment is performed, except that the potential of the netB becomes at the high level every predetermined period in accordance with the change of the potential of the third clock CKC and the thin-film transistor T3 becomes in an on state.

7.4 Effect

According to the present embodiment, during a period before the time point t0 and during a period after the time point t4, the potential of the netB becomes at a high level every predetermined period in accordance with the change of the potential of the third clock CKC (see FIG. 24). Therefore, during a period before the time point t0 and during a period after the time point t4, the thin-film transistor T3 becomes in an on state every predetermined period. Consequently, even when a shift of a threshold voltage of the thin-film transistor TS occurs due to high-temperature aging and a leakage current in the thin-film transistor TS becomes large, for example, the potential of the netA is securely set to a low level every predetermined period, and output of an abnormal pulse from the output terminal 51 is suppressed. Further, occurrence of an abnormal operation of a shift register due to sequential application of such an abnormal pulse to a latter stage is suppressed.

7.5 A Modification

The configuration may be such that a thin-film transistor that sets a potential of the netB to a low level when the fourth clock CKD (a signal of which a phase is shifted by 180 degrees from that of the second clock CKB shown in FIG. 24) is at a high level is provided in addition to the configuration shown in FIG. 23. With this, the potential of the netB is set to the low level during a period when the fourth clock CKD is at the high level. Therefore, a shift of the threshold voltage of the thin-film transistor T3 is suppressed.

8. An Eighth Embodiment

8.1 An Overall Configuration and a Configuration of a Gate Driver

In this embodiment, an overall configuration and a schematic configuration of a gate driver are substantially similar to the configurations in the first embodiment shown in FIGS. 2 and 3, and therefore, a detailed description is omitted. Note that, in the first embodiment, as a signal for ending a scanning of the gate bus lines GL1 to GL8, the first to third gate end pulse signals GEP1 to GEP3 are transmitted from the display control circuit 20 to the gate driver 40, however, in the present embodiment, only one gate end pulse signal GEP is transmitted from the display control circuit 20 to the gate driver 40 as a signal for ending the scanning of the gate bus lines GL1 to GL8.

Figure 25:
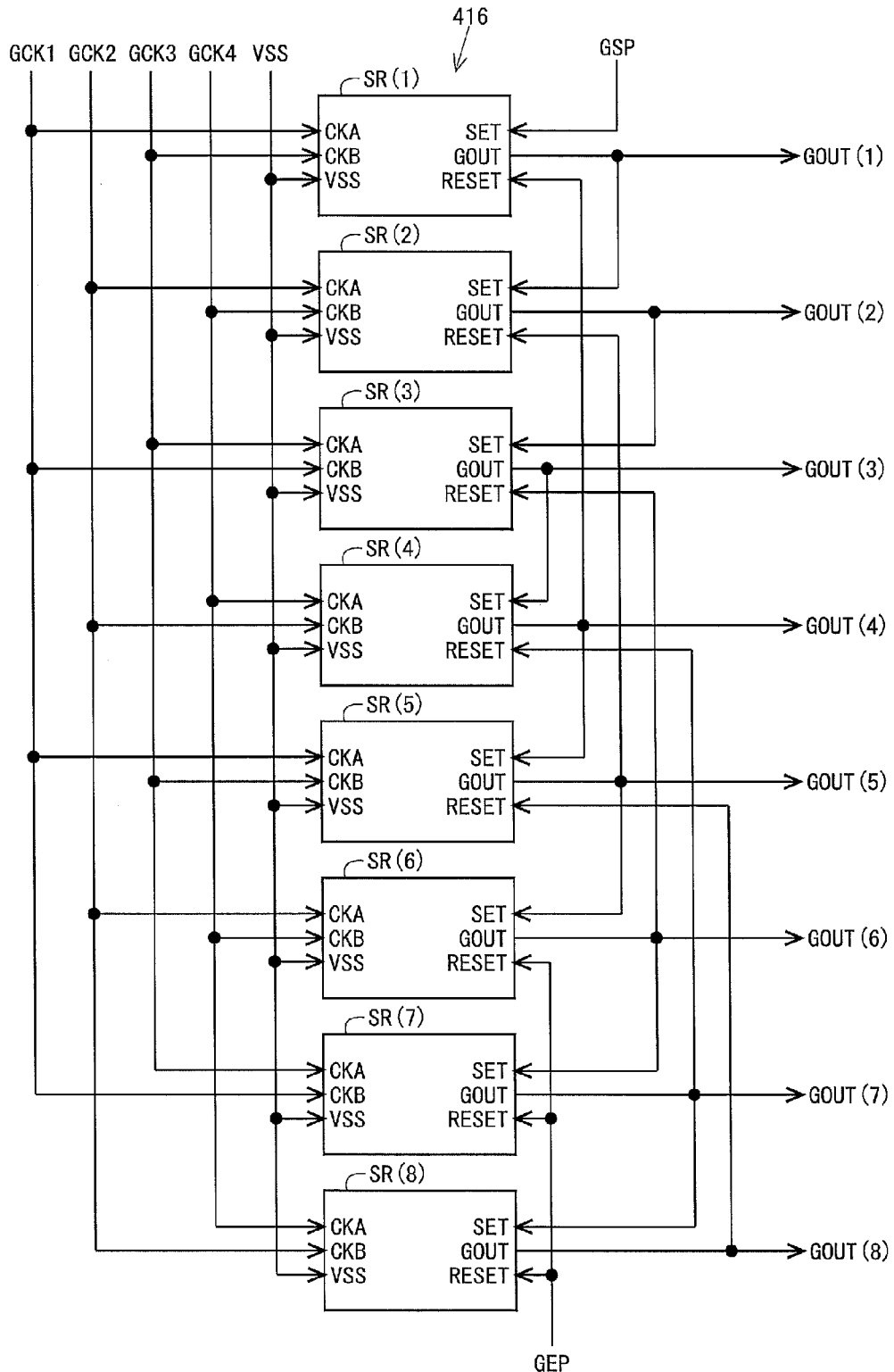
FIG. 25 is a block diagram showing a configuration of a shift register within a gate driver in an eighth embodiment of the present invention.

FIG. 25 is a block diagram showing a configuration of a shift register 416 within the gate driver 40 according to the present embodiment. As shown in FIG. 25, the shift register 416 is configured by eight bistable circuits SR(1) to SR(8). Each bistable circuit is provided with input terminals for receiving two-phase clock signals CKA and CKB respectively, an input terminal for receiving a low-level power source voltage VSS, an input terminal for receiving a set signal SET, an input terminal for receiving a reset signal RESET, and an output terminal for outputting a scanning signal GOUT. Here, a configuration of each stage (bistable circuit) of the shift register 416 is similar to the configuration in the first embodiment shown in FIG. 5.

In the first embodiment, as shown in FIG. 1, as the reset signal RESET, the first gate end pulse signal GEP1 is provided to the sixth stage SR(6), the second gate end pulse signal GEP2 is provided to the seventh stage SR(7), and the third gate end pulse signal GEP3 is provided to the eighth stage SR(8). On the other hand, in the present embodiment, the above-described gate end pulse signal GEP is provided as the reset signal RESET, to all the sixth stage SR(6), the seventh stage SR(7), and the eighth stage SR(8) as shown in FIG. 25.

8.2 An Operation of a Shift Register

Figure 26:
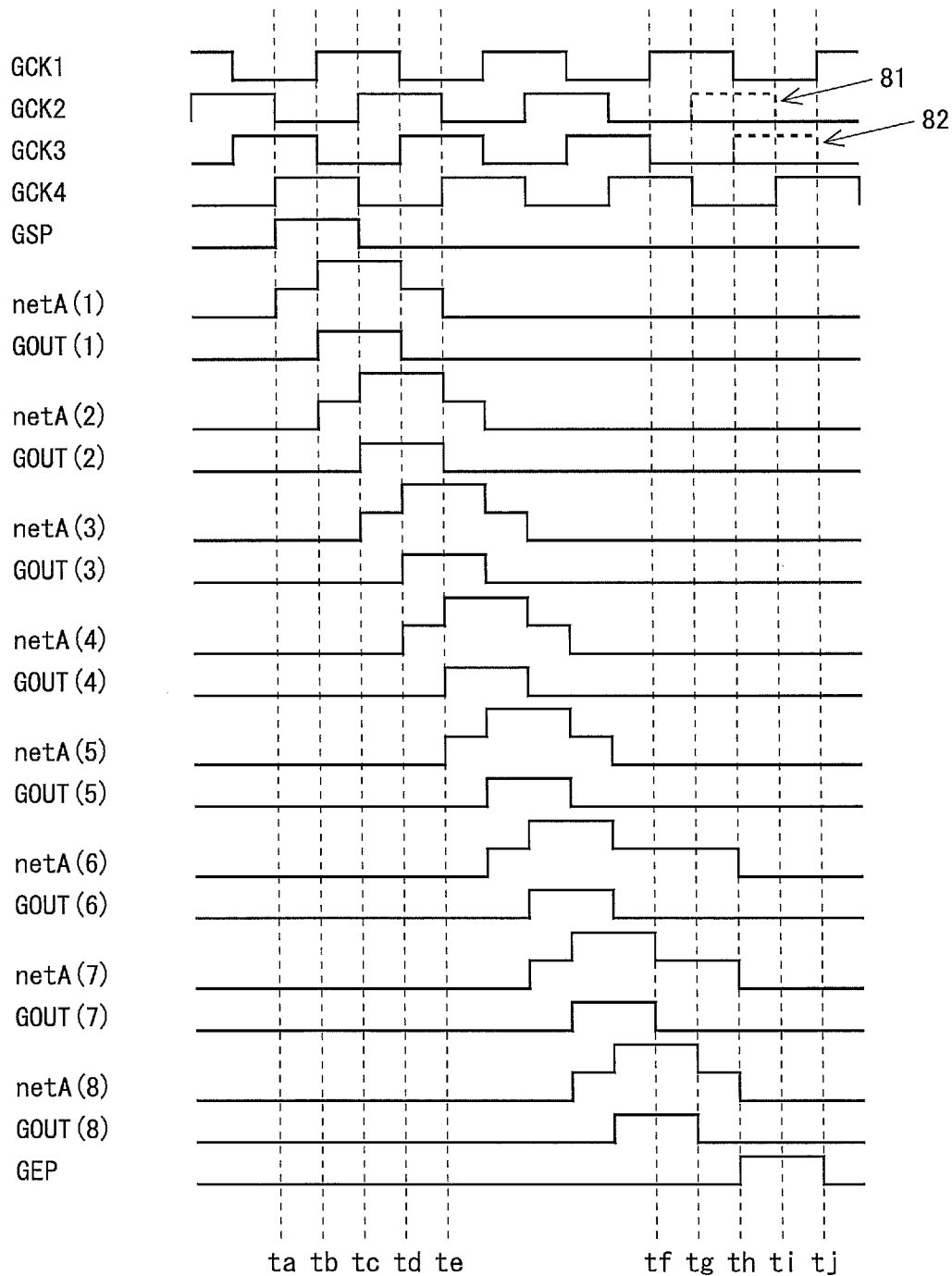
FIG. 26 is a timing chart for describing an overall operation of the shift register in the eighth embodiment.
Figure 27:
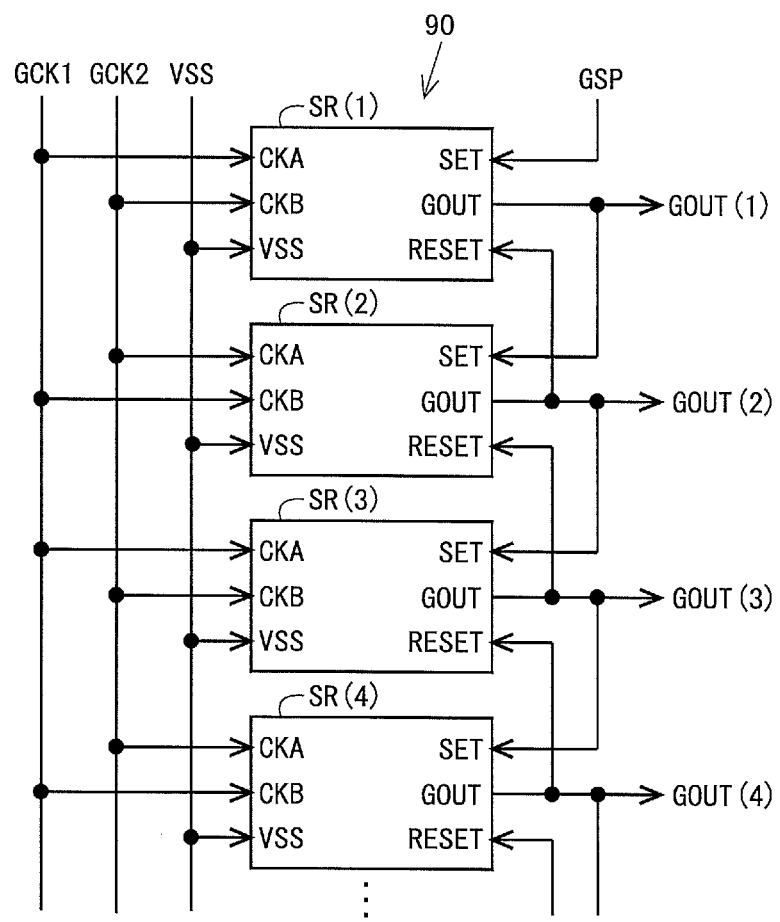
FIG. 27 is a block diagram showing an example of a configuration of a gate driver of a conventional display device.

An overall operation of the shift register 416 according to the present embodiment is described next with reference to FIG. 26. Here, an operation of each stage (bistable circuit) of the shift register 416 is similar to that in the first embodiment, and therefore, its description is omitted. In the present embodiment, during a period before the time point tf, an operation similar to that in the first embodiment is performed. At the time point tf and the time point tg, a pulse is not generated in the reset signal RESET that is provided to any stage. Therefore, in any stage, the potential of the netA does not change from the high level to the low level at timings of the time point tf or the time point tg. At the time point th, a pulse of the gate end pulse signal GEP is generated, as shown in FIG. 26. The gate end pulse signal GEP is provided to the sixth stage SR(6) to the eighth stage SR(8) as the reset signal RESET. Accordingly, the potential of the netA of the sixth stage SR(6) to the eighth stage SR(8) changes from the high level to the low level.

When the second gate clock signal GCK2 changes from the low level to the high level at the timing of the time point tg, there is a risk that the potential of the netA of the sixth stage SR(6) increases due to the bootstrap described above. Therefore, it is preferable to arrange such that the second gate clock signal GCK2 does not become at a high level during a period from the time point tg to a time point ti (see a portion indicated by an arrow marked by a reference numeral 81 in FIG. 26). Similarly, when the third gate clock signal GCK3 changes from the low level to the high level at the timing of the time point th, there is a risk that the potential of the netA of the seventh stage SR(7) increases due to the bootstrap described above. Therefore, it is preferable to arrange such that the third gate clock signal GCK3 does not become at a high level during a period from the time point th to the time point tj (see a portion indicated by an arrow marked by a reference numeral 82 in FIG. 26).

8.3 Effect

According to the present embodiment, only one gate end pulse signal GEP is provided as a signal for ending the scanning of the gate bus lines GL1 to GL8. Therefore, as compared with the first embodiment, signal wirings can be decreased, and signals to be generated by the display control circuit 20 can be decreased. Accordingly, the effect of reduction of a circuit area, reduction of current consumption, and cost reduction can further be enhanced.

8.4 A Modification

In the eighth embodiment, although a signal that is provided as the reset signal RESET of the sixth stage SR(6) to the eighth stage SR(8) is realized by one gate end pulse signal GEP, it can be realized by two gate end pulse signals.

Further, by configuring such that a pulse of the gate end pulse signal GEP is outputted during a period when the first to fourth gate clock signals GCK1 to GCK4 are at a low level, the potential of the netA of the sixth stage SR(6) to the eighth stage SR(8) can be securely decreased to the low level.

In the eighth embodiment, although the gate end pulse signal GEP is provided as the reset signal RESET of the sixth stage SR(6) to the eighth stage SR(8), the configuration may be such that the gate start pulse signal GSP is provided as the reset signal RESET of the sixth stage SR(6) to the eighth stage SR(8).

Further, as a configuration to suppress the increase in the potential of the netA of the sixth stage SR(6) at the timing of the time point tg in FIG. 26, and to suppress the increase in the potential of the netA of the seventh stage SR(7) at the timing of the time point th in FIG. 26, output of a pulse of the first clock CKA may be suppressed based on a clock signal and a reset signal within each stage (bistable circuit) of the shift register 416.

Further, the configuration may be such that any one of the sixth stage SR(6) to the eighth stage SR(8) includes a thin-film transistor (tenth switching element) in which the gate end pulse signal GEP is provided to a gate terminal, a drain terminal is connected to the output terminal 51, and a source terminal is connected to the power source voltage VSS.

9. Others

Although the above embodiments are described by taking a liquid crystal display device as an example, the present invention is not limited to this. The present invention can be also applied to other display devices such as an organic EL (Electro Luminescence).

DESCRIPTION OF REFERENCE CHARACTERS

10 . . . Display unit
20 . . . Display control unit
30 . . . Source driver (video signal line drive circuit)
40 . . . Gate driver (scanning signal line drive circuit)
41 to 47 . . . Input terminal (of bistable circuit)
51 . . . Output terminal of (bistable circuit)
410 to 416 . . . Shift register
SR(1) to SR(n) . . . Bistable circuit
TS, T1 to T8 . . . Thin-film transistor
C1 . . . Capacitor GL1 to GLn ... Gate bus line
SL1 to SLm ... Source bus line
GSP ... Gate start pulse signal
GEP1 to GEP3 ... First to third gate end pulse signals
GCK1 to GCK4 ... First to fourth gate clock signals
CKA, CKB, CKC, CKD ... First clock, second clock, third clock, fourth clock
GOUT(1) to GOUT(n) ... Scanning signal
SET ... Set signal
RESET ... Reset signal

The invention claimed is:

1. A shift register comprising a plurality of bistable circuits each having a first state and a second state and connected in series with each other, in which the plurality of bistable circuits sequentially become in the first state based on at least four-phase clock signals including two-phase clock signals which are provided as a first clock signal and a second clock signal to odd-order stage bistable circuits out of the plurality of bistable circuits, and two-phase clock signals which are provided as the first clock signal and the second clock signal to even-order stage bistable circuits out of the plurality of bistable circuits, wherein
each bistable circuit includes:
an output node that outputs a state signal indicating either one of the first state and the second state;
an output-control switching element in which the first clock signal is provided to a second electrode, and a third electrode is connected to the output node;
a first-node charge unit for charging a first node connected to a first electrode of the output-control switching element based on a state signal outputted from a bistable circuit of a pre-stage or a stage before the pre-stage of each bistable circuit concerned; and
a first-node discharge unit for discharging the first node based on a state signal outputted from a bistable circuit of a third stage after each bistable circuit concerned.

2. The shift register according to claim 1, wherein a phase of the first clock signal and a phase of the second clock signal are shifted by 180 degrees from each other.

3. The shift register according to claim 1, wherein a phase of two-phase clock signals provided to the odd-order stage bistable circuits and a phase of two-phase clock signals provided to the even-order stage bistable circuits are shifted by 90 degrees from each other.

4. The shift register according to claim 1, wherein a timing when the first clock signal changes from a high level to a low level is the same as a timing when the second clock signal changes from a low level to a high level, and also a timing when the first clock signal changes from the low level to the high level is the same as a timing when the second clock signal changes from the high level to the low level.

5. The shift register according to claim 1, wherein on-duty of each of the four-phase clock signals is 50%.

6. The shift register according to claim 1, wherein
in each bistable circuit,
the first-node charge unit includes a first switching element in which a state signal outputted from a pre-stage bistable circuit of each bistable circuit concerned is provided to a first electrode and a second electrode, and a third electrode is connected to the first node, and
the first-node discharge unit includes a second switching element in which a state signal outputted from a bistable circuit of a third stage after each bistable circuit concerned is provided to a first electrode, a second electrode is connected to the first node, and a low-level potential is provided to a third electrode.

7. The shift register according to claim 1, wherein
each bistable circuit further includes:
a third switching element in which a second electrode is connected to the first node, and a low-level potential is provided to a third electrode; and
a second node control unit that controls a potential of a second node connected to a first electrode of the third switching element, based on the second clock signal and a potential of the first node.

8. The shift register according to claim 7, wherein
the second node control unit includes:
a fourth switching element in which the second clock signal is provided to a first electrode and a second electrode, and a third electrode is connected to the second node; and
a fifth switching element in which a first electrode is connected to the first node, a second electrode is connected to the second node, and a low-level potential is provided to a third electrode.

9. The shift register according to claim 1, wherein
the odd-order stage bistable circuits receive one of two-phase clock signals that are provided to the even-order stage bistable circuits, as a third clock signal,
the even-order stage bistable circuits receive one of two-phase clock signals that are provided to the odd-order stage bistable circuits, as the third clock signal, and
each bistable circuit further includes
a third switching element in which a second electrode is connected to the first node, and a low-level potential is provided to a third electrode, and
a second-node control unit that controls a potential of a second node connected to a first electrode of the third switching element, based on the third clock signal and a potential of the first node.

10. The shift register according to claim 9, wherein
the second node control unit includes:
a fourth switching element in which the third clock signal is provided to a first electrode and a second electrode, and a third electrode is connected to the second node; and
a fifth switching element in which a first electrode is connected to the first node, a second electrode is connected to the second node, and a low-level potential is provided to a third electrode.

11. The shift register according to claim 7, wherein
in each bistable circuit, the second node control unit further includes a sixth switching element in which a state signal outputted from a next-stage bistable circuit of each bistable circuit concerned is provided to a first electrode, a second electrode is connected to the second node, and a low-level potential is provided to a third electrode.

12. The shift register according to claim 7, wherein
each bistable circuit further includes a second first-node charge unit for charging the first node based on a state signal outputted from a next-stage bistable circuit of each bistable circuit concerned.

13. The shift register according to claim 12, wherein
in each bistable circuit, the second first-node charge unit includes a seventh switching element in which a state signal outputted from a next-stage bistable circuit of each bistable circuit concerned is provided to a first electrode and a second electrode, and a third electrode is connected to the first node.

14. The shift register according to claim 1, wherein each bistable circuit further includes an eighth switching element in which the second clock signal is provided to a first electrode, a second electrode is connected to the output node, and a low-level potential is provided to a third electrode.

15. The shift register according to claim 1, wherein each bistable circuit further includes a capacitor in which one end is connected to the first node, and the other end is connected to the output node.

16. The shift register according to claim 1, wherein
each bistable circuit further includes a ninth switching element in which a state signal outputted from a bistable circuit of a second stage or a third stage after each bistable circuit concerned is provided to a first electrode, a second electrode is connected to the output node, and a low-level potential is provided to a third electrode.

17. The shift register according to claim 1, wherein
three scanning end signals for discharging the first node that is included in each of bistable circuits of a last-stage, a stage before the last stage, and a second stage before the last stage out of the plurality of bistable circuits, by the first-node discharge unit respectively, are provided from an outside.

18. The shift register according to claim 17, wherein
at least two scanning end signals out of the three scanning end signals are realized by one signal.

19. The shift register according to claim 18, wherein
in each of bistable circuits of a last-stage, a stage before the last stage, and a second stage before the last stage out of the plurality of bistable circuits, a change of the first clock signal from a low level to a high level is suppressed, during a period until the first node is discharged by the first-node discharge unit, after the first node is charged by the first-node charge unit.

20. The shift register according to claim 17, wherein
any one of bistable circuits of a last-stage, a stage before the last stage, and a second stage before the last stage out of the plurality of bistable circuits includes a tenth switching element in which the scanning end signal is provided to a first electrode, a second electrode is connected to the output node, and a low-level potential is provided to a third electrode.

21. The shift register according to claim 1, wherein the shift register is formed by using amorphous silicon.

22. The shift register according to claim 1, wherein the shift register is formed by using microcrystalline silicon.

23. The shift register according to claim 1, wherein the shift register is formed by using polycrystalline silicon.

24. The shift register according to claim 1, wherein the shift register is formed by using an oxide semiconductor.

25. A scanning signal line drive circuit of a display device, for driving a plurality of scanning signal lines that are provided in a display unit, comprising:
the shift register according to claim 1, wherein
the plurality of bistable circuits are provided so as to have a one-to-one correspondence with the plurality of scanning signal lines, and
each bistable circuit provides a state signal outputted from the output node, to a scanning signal line corresponding to each bistable circuit concerned as a scanning signal.

26. A display device comprising the scanning signal line drive circuit according to claim 25, including the display unit.

27. The display device according to claim 26, wherein a shift register including the plurality of bistable circuits is provided at both one end side and the other end side of the display unit, respectively.

28. The display device according to claim 26, wherein the odd-order stage bistable circuits are provided at one end side of the display unit, and the even-order stage bistable circuits are provided at the other end side of the display unit.

* * * * *